United States Patent
Takei et al.

(10) Patent No.: US 10,128,369 B2
(45) Date of Patent: Nov. 13, 2018

(54) SILICON CARBIDE SEMICONDUCTOR DEVICE, METHOD OF MANUFACTURING SILICON CARBIDE SEMICONDUCTOR DEVICE, AND METHOD OF CONTROLLING SILICON CARBIDE SEMICONDUCTOR DEVICE

(71) Applicant: Fuji Electric Co., Ltd., Kanagawa (JP)

(72) Inventors: Manabu Takei, Ibaraki (JP); Ryuji Yamada, Tokyo (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/477,304

(22) Filed: Apr. 3, 2017

(65) Prior Publication Data

US 2017/0301789 A1    Oct. 19, 2017

(30) Foreign Application Priority Data

Apr. 15, 2016  (JP) ................ 2016-082390

(51) Int. Cl.
| | |
|---|---|
| *H01L 29/78* | (2006.01) |
| *H01L 29/16* | (2006.01) |
| *H01L 29/66* | (2006.01) |
| *H03K 17/14* | (2006.01) |

(52) U.S. Cl.
CPC ...... *H01L 29/7813* (2013.01); *H01L 29/1608* (2013.01); *H01L 29/66734* (2013.01); *H03K 17/145* (2013.01)

(58) Field of Classification Search
CPC ............ H01L 29/7813; H01L 29/1608; H01L 29/66734; H03K 17/145
See application file for complete search history.

(56) References Cited

U.S. PATENT DOCUMENTS

| | | | |
|---|---|---|---|
| 8,410,489 B2 | 4/2013 | Adachi et al. | |
| 8,598,652 B2* | 12/2013 | Takaya | H01L 29/0623 257/331 |
| 8,772,788 B2* | 7/2014 | Ikegami | H01L 29/7802 257/77 |
| 2008/0230787 A1* | 9/2008 | Suzuki | H01L 29/0623 257/77 |
| 2017/0141223 A1* | 5/2017 | Hoshi | H01L 29/7813 |
| 2017/0221714 A1* | 8/2017 | Wakimoto | H01L 21/26506 |

FOREIGN PATENT DOCUMENTS

JP      2012-104856 A      5/2012

* cited by examiner

*Primary Examiner* — William Coleman
(74) *Attorney, Agent, or Firm* — Chen Yoshimura LLP

(57) ABSTRACT

In a trench-gate vertical MOSFET, an n-type drift layer and p-type base layer are epitaxially grown on an $n^+$ silicon carbide substrate, and an $n^{++}$ source region and $p^{++}$ contact region are provided inside the p-type base layer. The first source electrode contacts the $n^{++}$ source region, and the second source electrode contacts the $p^{++}$ contact region. The first source electrode and second source electrode are separated from each other.

11 Claims, 22 Drawing Sheets

SILICON CARBIDE SEMICONDUCTOR DEVICE, METHOD OF MANUFACTURING SILICON CARBIDE SEMICONDUCTOR DEVICE, AND METHOD OF CONTROLLING SILICON CARBIDE SEMICONDUCTOR DEVICE

BACKGROUND OF THE INVENTION

Technical Field

The present invention relates to a silicon carbide semiconductor device, a method of manufacturing a silicon carbide semiconductor device, and a method of controlling a silicon carbide semiconductor device.

Background Art

Silicon carbide (SiC) shows promise as a next-generation semiconductor material that will replace silicon (Si). A semiconductor element that uses silicon carbide as the semiconductor material (hereinafter, "silicon carbide semiconductor device") has various advantages over conventional semiconductor devices that use silicon, such as being able to reduce ON resistance of devices to one in several hundred as compared to conventional silicon devices, and being able to operate in higher temperature environments (200° C. or higher). This is due to the advantages inherent to silicon carbide, namely having a band gap that is approximately three times larger than that of silicon and having an insulation breakdown electric field strength that is almost an order of magnitude greater than silicon.

Silicon carbide semiconductor devices have been used for Schottky barrier diodes and planar-gate and trench-gate vertical MOSFETs (metal oxide semiconductor field effect transistors).

The structure of conventional silicon carbide semiconductor devices will be described using a trench-gate vertical MOSFET as an example. FIG. 18 is a cross-sectional view of a structure of a conventional silicon carbide semiconductor device. The conventional silicon carbide semiconductor shown in FIG. 18 includes an ordinary trench MOS gate in the front surface ($p^+$ base region 3 side surface) side of a semiconductor base material made of silicon carbide (hereinafter, "silicon carbide base material"). The silicon carbide base material (semiconductor chip) 100 is constituted by silicon carbide layers that respectively serve as an n-type drift layer 2, $n^+$ region 5, and p-type base layer 6 epitaxially grown in this order on an $n^+$ support substrate made of silicon carbide (hereinafter, "$n^+$ silicon carbide substrate").

A first $p^+$ region 3 is selectively provided in the $n^+$ region 5 so as to cover the entire bottom surface of a trench 18. A second $p^+$ region 4 is also selectively provided in the $n^+$ region 5 between adjacent trenches 18 (the mesa section). The second $p^+$region 4 contacts the p-type base layer 6 and is provided at the same depth as the first $p^+$ region 3. The reference characters 7, 8, 9, 10, 11, 14, and 17 respectively represent an $n^{++}$ source region, $p^{++}$ contact region, gate oxide film, gate electrode, interlayer insulating film, source electrode, and drain electrode.

Trench-gate vertical MOSFETs have embedded therein a parasitic pn diode made of the p-base layer 6 and n-type drift layer 2 as a body diode between the source/drain. Therefore, it is possible to omit the free-wheeling diode used in inverters, which contributes to reducing costs and miniaturizing the device.

FIG. 19 is one example of an inverter circuit that uses a conventional silicon carbide MOSFET. The inverter circuit 1900 includes a plurality of MOSFETs 1901 and the circuit drives a load 1903 such as motor. In FIG. 19, a diode 1902 shows the parasitic pn diode 1902 of the MOSFET 1901. Hereinafter, the parasitic pn diode of the semiconductor element will be referred to as the "built-in diode." In FIG. 19, only one phase of the inverter circuit is shown, or namely one set of the MOSFETs 1901 connected in series. In the inverter circuit 1900, the circuit above the load 1903 (opposite to GND) is referred to as the upper arm, and the circuit below the load 1903 (on the GND side) is referred to as the lower arm.

In the inverter circuit 1900 shown in FIG. 19, when the lower arm is in recovery mode, or namely when the gate of the MOSFET 1901 of the upper arm is OFF, the principal current (load current) of the inductance component of the load 1903 continues to flow to the MOSFET 1901 of the upper arm, and thus recovery current flows to the built-in diode 1902 of the MOSFET 1901 of the lower arm. At such time, if the gate of the lower arm MOSFET 1901 is turned ON, current flows through the MOS channel, and the return current flows through the channel of the MOSFET 1901 (hereinafter, "MOS channel") rather than the built-in diode 1902. This gate control scheme is called synchronous rectification.

Next, the transition from the mode (synchronous rectification mode) where current flows through the MOS channel to the mode (bipolar mode) where current flows to the built-in diode 1902 will be explained in detail. FIG. 20 is a cross-sectional view of the current path in synchronous rectification mode of the conventional silicon carbide semiconductor device. When a fixed positive voltage such as +15V is applied to the gate electrode 10 of the MOSFET 1901, the channel of the MOSFET turns ON. In such a case, as shown in FIG. 20, 100% of the recovery current flows through the p-type base layer 6, $n^+$ region 5, and n-type drift layer 2. Thus, all of the current component is electron current, and the MOSFET 1901 has unipolar operation. In FIG. 20, GND indicates that the source electrode is grounded, +15V indicates that a positive voltage of +15V is applied to the gate electrode, and negative bias indicates that a negative voltage is applied to the drain electrode.

FIG. 21 is a cross-sectional view of the current path in an intermediate mode of the conventional silicon carbide semiconductor device. As the gate voltage applied to the gate electrode 10 of the MOSFET 1901 is lowered, channel resistance increases and thus source/drain voltage increases. The pn junction of the built-in diode of the MOSFET 1901 then becomes sufficiently biased. Therefore, as shown in FIG. 21, in addition to the current flowing through the channel of the MOSFET 1901, a bipolar current begins to flow to the built-in diode through the $p^{++}$ contact region 8, p-type base layer 6, $p^+$ region 4, $n^+$ region 5, and n-type drift layer 2.

FIG. 22 is a cross-sectional view of the current path in the bipolar mode of the conventional silicon carbide semiconductor device. When the gate voltage applied to the gate electrode 10 of the MOSFET 1901 becomes lower than the threshold voltage, current stops flowing to the channel of the MOSFET 1901. Therefore, as shown in FIG. 22, 100% of the recovery current becomes the bipolar current of the built-in diode.

This type of technology is well-known; namely, in an inverter circuit, when the gate voltage of the semiconductor device is less than or equal to the threshold voltage, the drain/source voltage is set to be less than or equal to the onset voltage of the built-in diode to cause unipolar current to flow to the semiconductor device in order to inhibit the occurrence of crystal defects (see Patent Document 1, for example).

RELATED ART DOCUMENT

Patent Document

Document 1: Japanese Patent Application Laid-Open Publication No. 2012-104856

SUMMARY OF THE INVENTION

In an inverter circuit, the timing at which the gate of the lower arm MOSFET is turned ON needs to be made several microseconds slower than the timing at which the gate of the upper arm MOSFET is turned ON. If the gate of the upper arm and lower arm MOSFETs were to turn ON at the same time, through-current would flow through both MOSFETs, causing significant damage and possibly destroying the device. In order to reliably prevent this, a period of several microseconds in which both MOSFETs are OFF at the same time (dead time) is provided.

The current flowing during this dead time period flows through the built-in diode, and holes are injected from the $p^{++}$ contact region. Accordingly, recombination of the electrons and holes occurs in the drift layer or silicon carbide substrate, and the recombination energy (3 eV) generated at this time corresponding to the bandgap causes movements of the basal plane dislocations, which is one type of crystal defect existing in the silicon carbide substrate, and expands the stacking fault interposed between the two basal plane dislocations.

If the stacking fault expands, it is harder for current to flow, and thus the ON resistance of the MOSFET and the forward voltage of the built-in diode will increase. If this operation continues, the stacking fault will cumulatively expand, and the damage caused to the inverter circuit will increase over time and the amount of heat generated will become greater, which can cause the device to malfunction. In order to prevent this problem, it is possible to connect SiC-SBDs in parallel to the MOSFETs and prevent the recovery current from flowing to the built-in diode of the MOSFETs. However, this causes an increase in the number of required chips and increases the cost of the semiconductor device.

In order to solve the problems with the conventional technology described above, the present invention aims at providing a silicon carbide semiconductor device that prevents an increase in the ON resistance of the device due to an expansion of stacking faults caused by conduction of the built-in diode in the silicon carbide semiconductor device, and a method of manufacturing the silicon carbide semiconductor device and a method of controlling the silicon carbide semiconductor device. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a silicon carbide semiconductor device, including: a first semiconductor layer of a first conductivity type in a front surface of a silicon carbide substrate; a second semiconductor layer of a second conductivity type on a side of the first semiconductor layer opposite to the silicon carbide substrate; a first semiconductor region of the first conductivity type selectively disposed inside the second semiconductor layer and having a higher impurity concentration than the silicon carbide substrate; a second semiconductor region of the second conductivity type selectively disposed inside the second semiconductor layer and having a higher impurity concentration than the second semiconductor layer; a gate oxide film contacting the second semiconductor layer; a gate electrode on a face of the gate oxide film opposite to a face of the gate oxide film contacting the second semiconductor layer; a first electrode contacting the first semiconductor region; a second electrode contacting the second semiconductor region and separated from the first electrode; and a third electrode on a rear surface of the silicon carbide substrate.

The silicon carbide semiconductor device of the present invention is further characterized by, with respect to the above-mentioned invention, the silicon carbide semiconductor device having a trench vertically penetrating the second semiconductor layer, and the gate electrode being inside the trench and the gate oxide film being between gate electrode and the trench.

The silicon carbide semiconductor device of the present invention is further characterized by, with respect to the above-mentioned invention, the second electrode being connected to the first electrode via an electrical resistor.

The silicon carbide semiconductor device of the present invention is further characterized by, with respect to the above-mentioned invention, the second electrode being connected to the first electrode via an electrical resistor and a diode, and the diode being connected via a cathode thereof to the first electrode and connected via an anode thereof to the second electrode.

The silicon carbide semiconductor device of the present invention is further characterized by, with respect to the above-mentioned invention, the electrical resistor and the diode being made of poly silicon deposited on the silicon carbide semiconductor device.

In another aspect, the present disclosure provides a method of manufacturing a silicon carbide semiconductor device, including: forming a first semiconductor layer of a first conductivity type in a front surface of a silicon carbide substrate; forming a second semiconductor layer of a second conductivity type on a side of the first semiconductor layer opposite to the silicon carbide substrate; selectively forming a first semiconductor region of the first conductivity type inside the second semiconductor layer at a higher impurity concentration than the silicon carbide substrate; selectively forming a second semiconductor region of the second conductivity type inside the second semiconductor layer and at a higher impurity concentration than the second semiconductor layer; forming a gate oxide film contacting the second semiconductor layer; forming a gate electrode on a face of the gate oxide film opposite to a face of the gate oxide film contacting the second semiconductor layer; forming a first electrode contacting the first semiconductor region; forming a second electrode contacting the second semiconductor region and separated from the first electrode; and forming a third electrode in a rear surface of the silicon carbide substrate.

In another aspect, the present disclosure provides a method of controlling a silicon carbide semiconductor device that includes a first semiconductor layer of a first conductivity type in a front surface of a silicon carbide substrate; a second semiconductor layer of a second conductivity type on a side of the first semiconductor layer opposite to the silicon carbide substrate; a first semiconductor region of the first conductivity type selectively disposed inside the second semiconductor layer and having a higher impurity concentration than the silicon carbide substrate; a second semiconductor region of the second conductivity type selectively disposed inside the second semiconductor layer and having a higher impurity concentration than the second semiconductor layer; a gate oxide film contacting the second semiconductor layer; a gate electrode on a face of the gate oxide film opposite to a face of the gate oxide film contacting the second semiconductor layer; a first electrode contacting the first semiconductor region; a second electrode contacting the second semiconductor region and separated from the first electrode; and a third electrode in a rear surface of the silicon carbide substrate, the method of controlling the silicon carbide semiconductor device including: measuring a value of current flowing to the second electrode from outside when currents are flowing from the first electrode and the second electrode toward the third electrode within the silicon carbide semiconductor device; and adjusting a proportion of the current flowing from the first electrode to the third electrode and the current flowing from the second electrode to the third electrode by setting a voltage applied to the gate electrode in accordance with the value of the current that has been measured.

The method of controlling the silicon carbide semiconductor device of the present invention is further characterized by, with respect to the above-mentioned invention, the step of measuring measuring an instantaneous value of the current flowing to the second electrode.

The method of controlling the silicon carbide semiconductor device of the present invention is further characterized by, with respect to the above-mentioned invention, the step of measuring measuring an average value over a prescribed duration of the current flowing to the second electrode.

The method of controlling the silicon carbide semiconductor device of the present invention is further characterized by, with respect to the above-mentioned invention, further including measuring a temperature of the silicon carbide semiconductor device, and the step of adjusting the proportion setting a voltage applied to the gate electrode in accordance with the value of the current and the temperature that have been measured.

The method of controlling the silicon carbide semiconductor device of the present invention is further characterized by, with respect to the above-mentioned invention, when the currents are flowing from the first electrode and the second electrode toward the third electrode, the current flowing toward the second electrode from outside being adjusted to be less than or equal to a prescribed value to cause contraction of crystal defects in the silicon carbide semiconductor device.

The invention described above makes it possible to draw the bipolar current outside due to the second source electrode (second electrode) contacting only the $p^{++}$ contact region (second semiconductor region of second conductivity type). This makes it possible to measure the bipolar current with an external circuit and to control the gate voltage based on the measured bipolar current such that the bipolar current is set to less than or equal to a prescribed value. Thus, it is possible to prevent expansion of stacking faults during operation of the inverter circuit; to cause stacking faults that have expanded to contract; and to prevent an increase in the ON resistance of the silicon carbide semiconductor device. When the silicon carbide semiconductor device is applied to an inverter circuit, it becomes harder for bipolar deterioration to occur, for example. Furthermore, even if bipolar deterioration were to occur, it is possible to cause the stacking faults to contract during circuit operation, which makes it possible to improve the long-term reliability of the silicon carbide semiconductor device.

The silicon carbide semiconductor device, method of manufacturing the silicon carbide semiconductor device, and method of controlling the silicon carbide semiconductor device of the present invention makes it possible to prevent an increase in the ON resistance of the device due to an expansion of stacking faults caused by conduction of the built-in diode in the silicon carbide semiconductor device. It is to be understood that both the foregoing general description and the following detailed description are exemplary and explanatory, and are intended to provide further explanation of the invention as claimed.

BRIEF DESCRIPTION OF THE DRAWINGS

FIG. 12A shows the concentration distribution of the impurities in the silicon carbide semiconductor device, FIG. 12B shows the potential distribution of the silicon carbide semiconductor device, and FIG. 12C shows the electron current distribution of the silicon carbide semiconductor device.

DETAILED DESCRIPTION OF EMBODIMENTS

Suitable embodiments of a silicon carbide semiconductor device, a method of manufacturing a silicon carbide semiconductor device, and a method of controlling a silicon carbide semiconductor device according to the present invention will be explained in detail below with reference to the attached drawings. In the present specification and attached drawings, electrons or holes in layers or areas marked with an "n" or "p" signify majority carriers. The "+" or "−" attached to the "n" or "p" respectively signify higher impurity concentrations and lower impurity concentrations than layers or areas without these marks. In the explanation of the embodiments below and the attached drawings, the same reference characteristics are attached to similar configurations and repetitive descriptions will be omitted.

Embodiments

Figure 1:
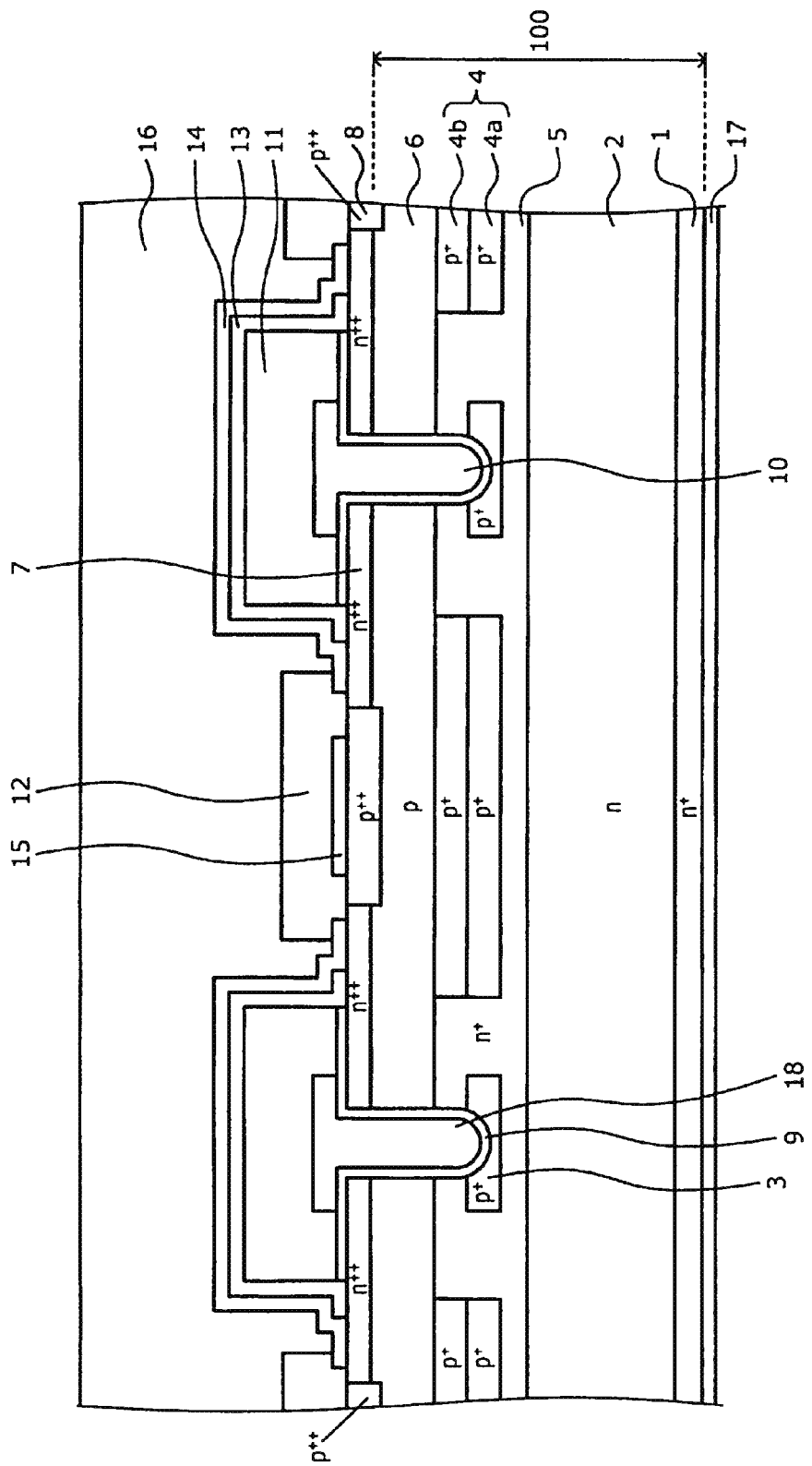
FIG. 1 is a cross-sectional view of the structure of a silicon carbide semiconductor device according to an embodiment.

FIG. 1 is a cross-sectional view of the structure of a silicon carbide semiconductor device according to an embodiment. FIG. 1 shows only two unit cells (functional units of the element), and the other unit cells adjacent to these two unit cells are omitted from the drawings (this is also the same for the other drawings). The silicon carbide semiconductor device of the embodiment shown in FIG. 1 is a MOSFET having a MOS gate in the front surface (p-type base layer 6-side surface) side of a semiconductor base material made of silicon carbide (silicon carbide base material: semiconductor chip) 100.

The silicon carbide base material 100 is constituted by silicon carbide layers that respectively serve as an n-type drift layer (first semiconductor layer of a first conductivity type) 2 and a p-type base layer (second semiconductor layer of a second conductivity type) 6 epitaxially grown in this order on an $n^+$ support substrate made of silicon carbide ($n^+$ silicon carbide substrate) 1. The MOS gate is constituted by the p-type base layer 6, an $n^{++}$ source region (first semiconductor region of the first conductivity type) 7, $p^{++}$ contact region (second semiconductor region of the second conductivity type) 8, trench 18, gate oxide film 9, and gate electrode 10. Specifically, an $n^+$ region 5 is provided in the surface layer on the source side of the n-type drift layer 2 (first source electrode 14 side) so as to contact the p-type base layer 6. The $n^+$ region 5 is a so-called "current spreading layer" (CSL) that reduces the spreading resistance of the carriers. This $n^+$ region 5 is uniformly provided in a direction parallel (hereinafter, horizontal direction) to the base material front surface (front surface of the silicon carbide base material 100), for example.

First and second p+ regions 3 and 4 are respectively and selectively provided in the n+ region 5. The first $p^+$ region 3 is provided so as to cover the bottom surface and bottom surface corner of the trench 18. The bottom surface corner of the trench 18 refers to the boundary between the bottom surface and side walls of the trench 18. The first $p^+$ region 3 is provided at a depth that does not reach the interface of the $n^+$ region 5 and n-type drift layer 2 from a position closer to the drain side than the interface of the p-type base layer 6 and $n^+$ region 5. Providing the first $p^+$ region 3 makes it possible to form a pn junction between the first $p^+$ region 3 and $n^+$ region 5 near the bottom surface of the trench 18.

The second $p^+$ region 4 is provided between adjacent trenches 18 (in the mesa section) separated from the first $p^+$ region 3 and contacting the p-type base layer 6. The second $p^+$ region 4 may alternatively have a portion extending towards the trench 18 and partially contacting the first $p^+$ region 3. Furthermore, the second p+ region 4 is provided at a depth that does not reach the interface of the n+ region 5 and n-type drift layer 2 from the interface of the p-type base layer 6 and n+ region 5. Providing the second $p^+$ region 4 makes it possible to form a pn junction between the second $p^+$ region 4 and $n^+$ region 5 between adjacent trenches 18 and at a location closer to the drain than the bottom surface of the trenches 18. Forming the pn junction between the first and second $p^+$ regions 3 and 4 and $n^+$ region 5 in this manner makes it possible to prevent a high electric field from being applied to the section of the gate oxide film 9 on the trench 18 bottom surface.

The $n^{++}$ source region 7 and $p^{++}$ contact region 8 are respectively selectively provided within the p-type base layer 6 so as to contact one another. The depth of the $p^{++}$ contact region 8 may be greater than the $n^{++}$ source region 7, for example.

The trench 18 penetrates the $n^{++}$ source region 7 and p-type base layer 6 from the base material front surface and reaches the $n^+$ region 5. The trench 18 has a stripe-like shape when seen from the top surface of the semiconductor device (the source electrode pad side), and the second source electrode 15 (described later) also has a stripe-like shape in a direction parallel to the trench 18. The gate oxide film 9 is provided inside the trench 18 along the side walls of the trench 18, and a gate electrode 10 made of polysilicon (poly-Si) is disposed on the inner side of the gate oxide film 9. The source side edge of the gat electrode 10 may either protrude or not protrude outwards from the base material front surface. The gate electrode 10 is electrically connected to a gate pad (not shown) by a section not shown in the drawings. The first interlayer insulating film 11 is provided so as to cover the gate electrode 10 embedded in the trench 18.

The first source electrode (first electrode) 14 connects to the n++ source region 7 via a contact hole in the first interlayer insulating film 11. The first source electrode 14 does not connect to the p++ contact region 6. The first source electrode 14 is made of aluminum (Al) at a thickness of 5 μm, for example. The current that flows through the first source electrode 14 is unipolar current (MOSFET channel current). A barrier metal 13 that prevents diffusion of metal atoms from the first source electrode 14 toward the gate electrode 10 may be provided between the first source electrode 14 and first interlayer insulating film 11, for example. A source electrode pad 16 is disposed on the first source electrode 14.

The second source electrode (second electrode) 15 is made of a sintering layer and connects to the p++ contact region 8 via a contact hole in the first interlayer insulating film 11. The second source electrode 15 does not connect to the n++ source region 7. The second source electrode 15 can be drawn out to the outside of the semiconductor device by separating only the portions contacting the p++ contact region 6. The current that flows through the second source electrode 15 is bipolar current (built-in diode current). A low-temperature 1 μm-thick second interlayer insulating film 12 is provided on the second source electrode 15. The second interlayer insulating film 12 is insulated and separated from the first source electrode 14 and second source electrode 15. Furthermore, the second source electrode 15 and gate electrode 10 are insulated and separated by the second interlayer insulating film 12. The second source electrode 15 need not be only a sintering layer, and may alternatively include approx. 1 μm-thick aluminum layered on top. The second source electrode 15 and gate electrode 10 are connected to respective electrode pads on the edge of the stripe and drawn to outside of the semiconductor device via aluminum wires. A drain electrode (third electrode) 17 is disposed on the rear surface of the silicon carbide base material 100 (rear surface of the n+ silicon carbide substrate 1 serving as the n+ drain region).

Expansion prevention and contraction of stacking faults for when a MOSFET of one embodiment is used in an inverter circuit will be described in detail below. As described above, detailed analysis of stacking fault expansion caused by recombination energy has shown that the current density of bipolar current, element temperature, etc. affect the behavior of fault expansion. Regarding current density in particular, it has been verified by experimentation that, at less than or equal to a certain constant value, stacking faults actually contract, and it is possible to use this phenomenon to cause stacking faults to contract during operation of the semiconductor device. Furthermore, the current density at which stacking faults switch from contraction to expansion is determined by element temperature.

Figure 20:
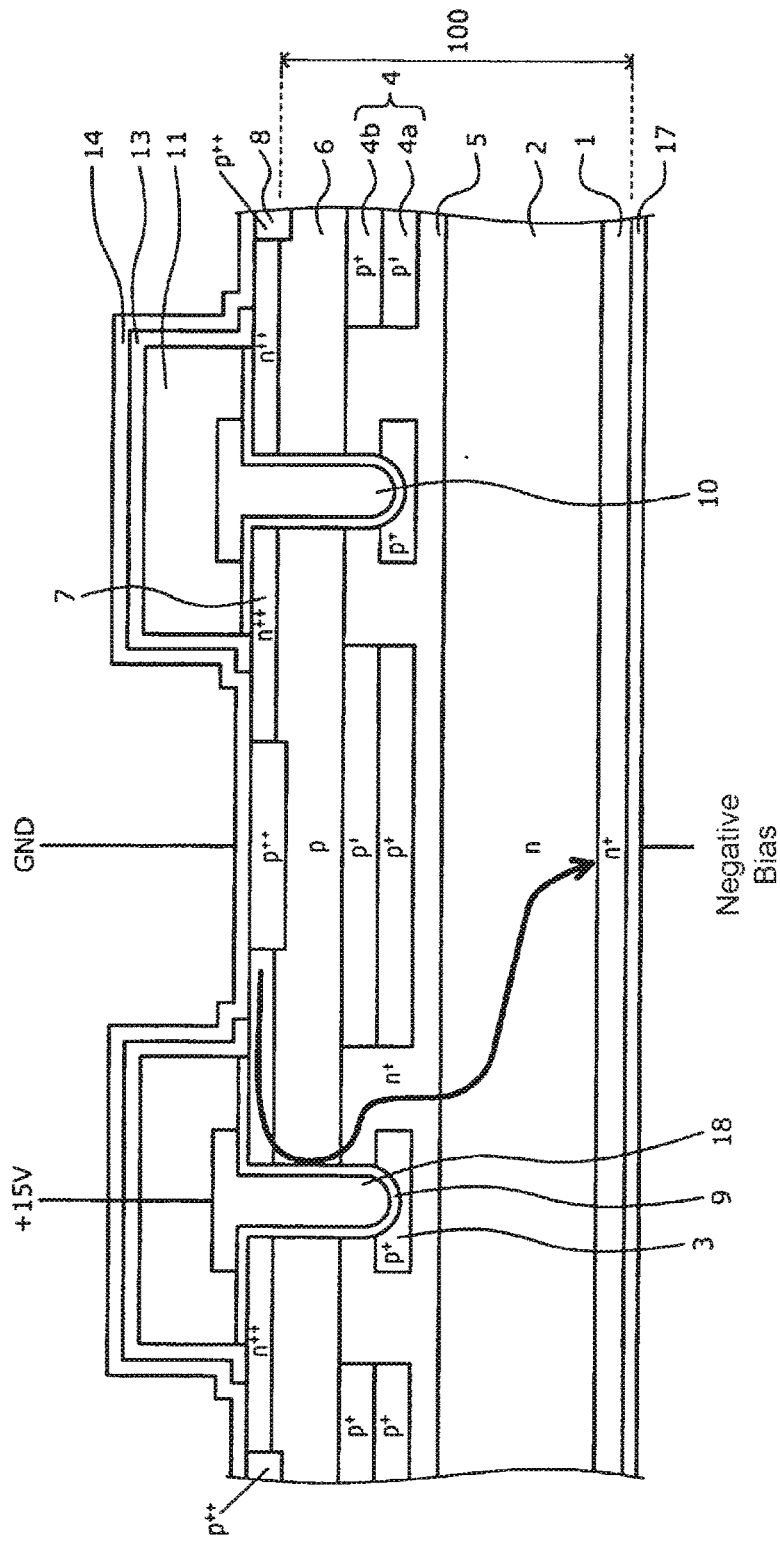
FIG. 20 is a cross-sectional view of the current path in synchronous rectification mode of the conventional silicon carbide semiconductor device.
Figure 21:
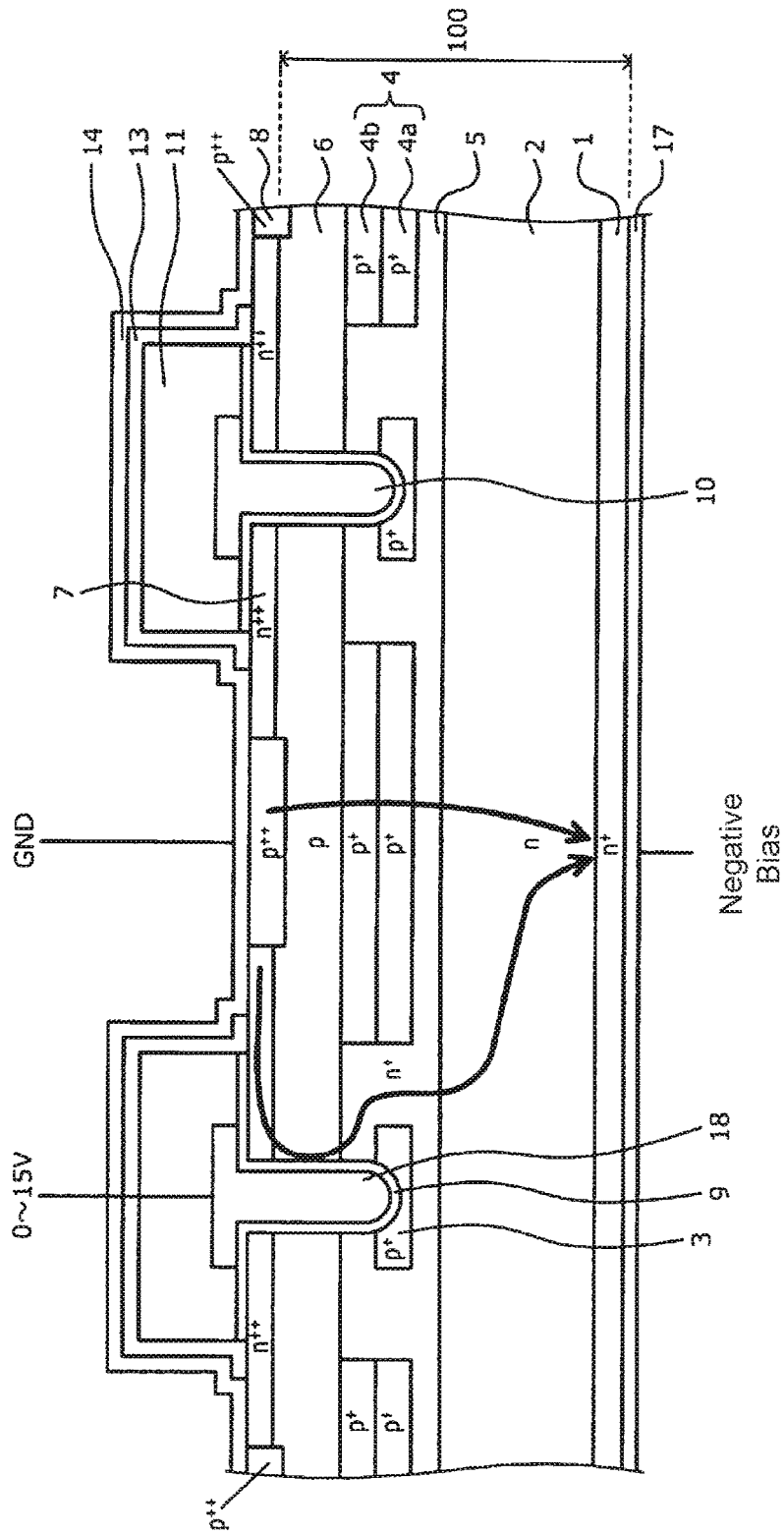
FIG. 21 is a cross-sectional view of the current path in the intermediate mode of the conventional silicon carbide semiconductor device.
Figure 22:
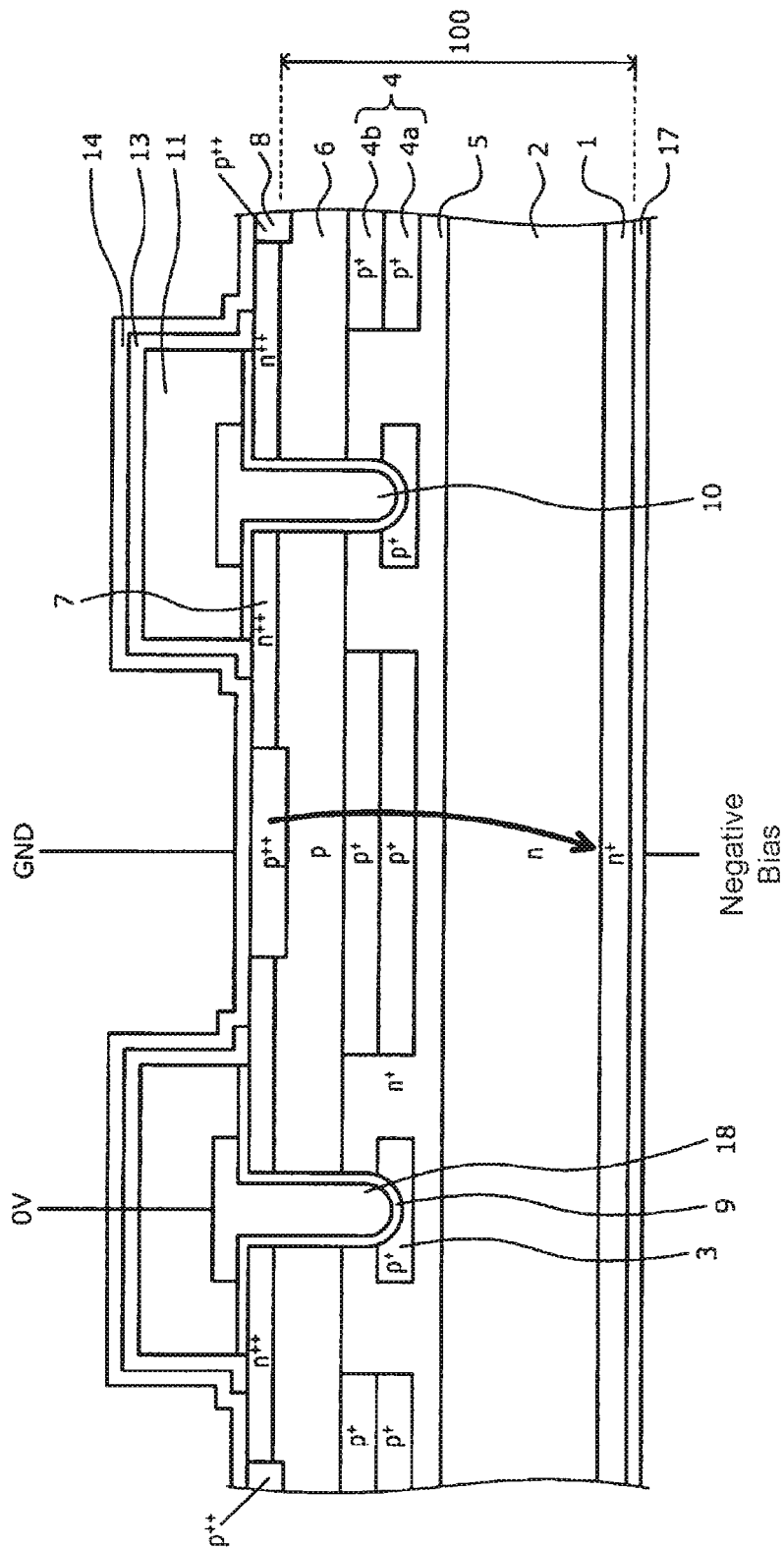
FIG. 22 is a cross-sectional view of the current path in the bipolar mode of the conventional silicon carbide semiconductor device.

Accordingly, when using the MOSFET in an inverter circuit, setting the bipolar current during dead time to less than or equal to a prescribed value can prevent the expansion of stacking faults. Moreover, allowing a prescribed current to flow to the MOSFET in the arm during synchronous rectification makes it possible to cause the stacking faults that have expanded to contract again. As shown in FIGS. 20 to 22, lowering the gate voltage causes bipolar current to start flowing to the built-in diode. Therefore, adjusting the gate voltage to a prescribed value makes it possible to set the bipolar current to a desired value, and adjusting the electron/hole recombination ratio (recombination rate) makes it possible to cause the stacking faults that have expanded to switch to contraction instead.

The gate voltage that will cause the bipolar current to be the desired value differs depending on the individual semiconductor device and also differs depending on the element temperature and transient state of the inverter circuit. Thus, it is necessary to measure bipolar current and control the gate voltage to the optimum value based on this measured current value.

To implement this control, in one embodiment, the source electrode is separated into the first source electrode 14 and second source electrode 15, and the bipolar current is drawn to outside by the second source electrode 15 being made to contact the p++ contact region 8. The second source electrode 15 makes it possible to measure the bipolar current with an external circuit, and the measured value can be sent to a gate driver circuit capable of setting the gate voltage in order to control the gate voltage, for example. In this manner, the MOSFET of one embodiment makes it possible to externally control gate voltage, and controlling the gate voltage makes it possible, via setting the bipolar current to less than or equal to a prescribed value, to prevent the expansion of stacking faults during operation of the inverter circuit and to cause stacking faults that have expanded to contract.

Method of Manufacturing Silicon Carbide Semiconductor Device of One Embodiment

Figure 2:
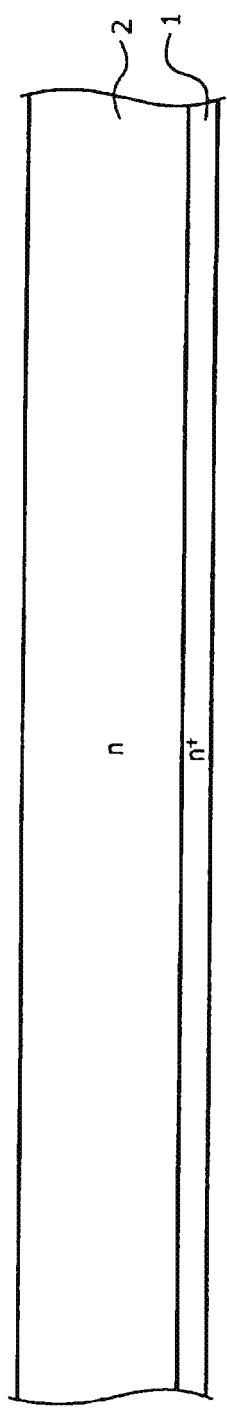
FIG. 2 is a first cross-sectional view of the silicon carbide semiconductor device of an embodiment during manufacturing.
Figure 3:
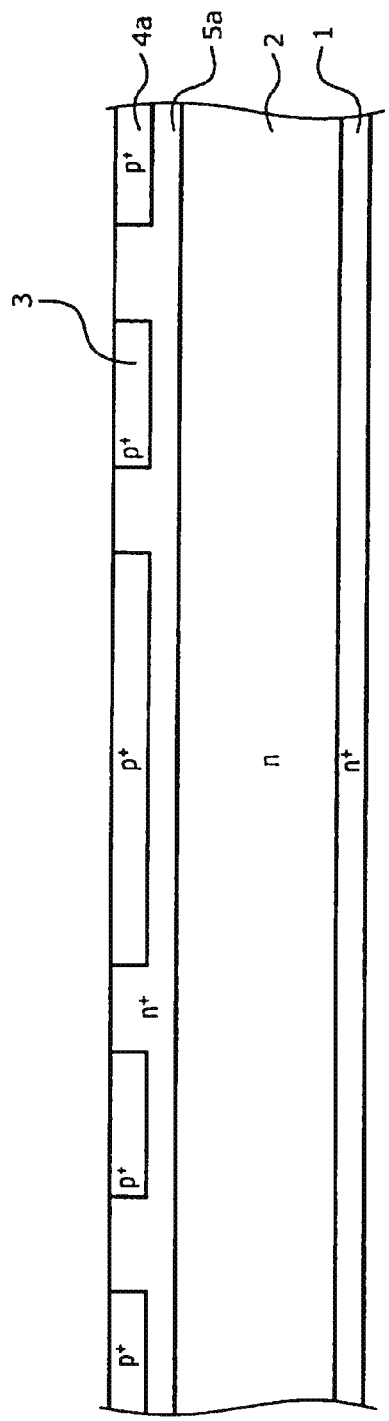
FIG. 3 is a second cross-sectional view of the silicon carbide semiconductor device of an embodiment during manufacturing.

Next, a method of manufacturing a silicon carbide semiconductor device according to an embodiment will be described. FIGS. 2 to 9 are cross-sectional views of a silicon carbide semiconductor device during the manufacturing thereof according to an embodiment. First, the n+ silicon carbide substrate 1 is prepared. Next, the n-type drift layer 2 is epitaxially grown on the front surface of the n+ silicon carbide substrate 1. This state is shown in FIG. 2.

Next, the first n+ region 5a is epitaxially grown on the n-type drift layer 2. This first n+ region 5a is part of the n+ region 5. Next, the first p+ region 3 and bottom second p+ region 4a are respectively selectively formed in the front surface layer of the first n+ region 5a via photolithography and ion injection of a p-type impurity. This bottom second p+ region 4a is part of the second p+ region 4. This state is shown in FIG. 2.

Figure 4:
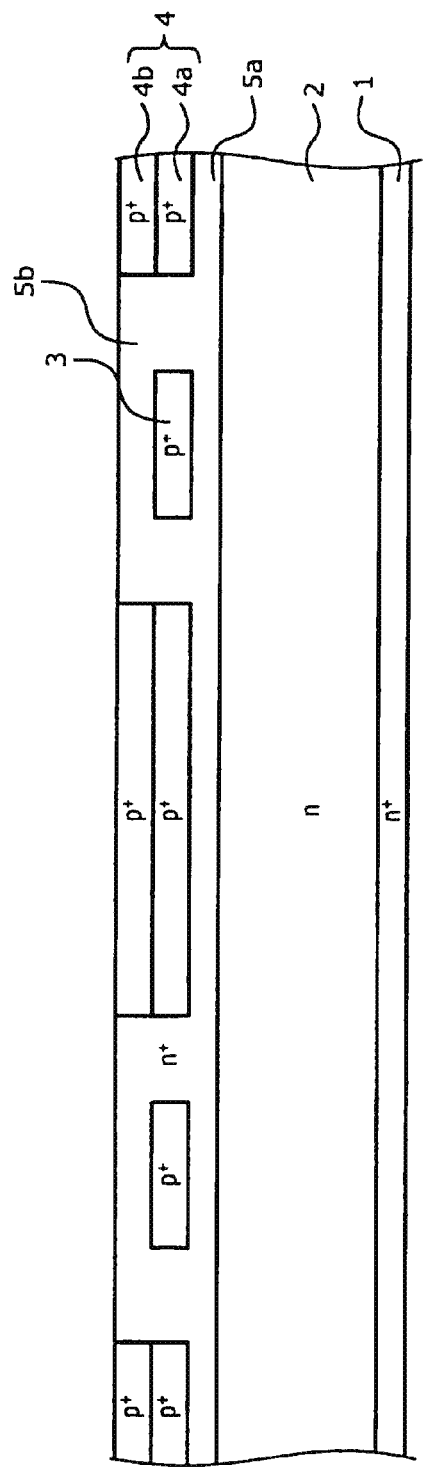
FIG. 4 is a third cross-sectional view of the silicon carbide semiconductor device of an embodiment during manufacturing.

Next, the second n+ region 5b is epitaxially grown on the n-type drift layer 2, first p+ region 3, and bottom second p+ region 4a. This second n+ region 5b is a part of the n+ region 5, and the first n+ region 5a and the second n+ region 5b combined together constitute the n+ region 5. Next, the top second p+ region 4b is respectively selectively formed in the front surface layer of the second n+ region 5b via photolithography and ion injection of a p-type impurity. This top second p+ region 4b is part of the second p+ region 4, and the bottom second p+ region 4a and the top second p+ region 4b combined together constitute the second p+ region 4. This state is shown in FIG. 4.

Figure 5:
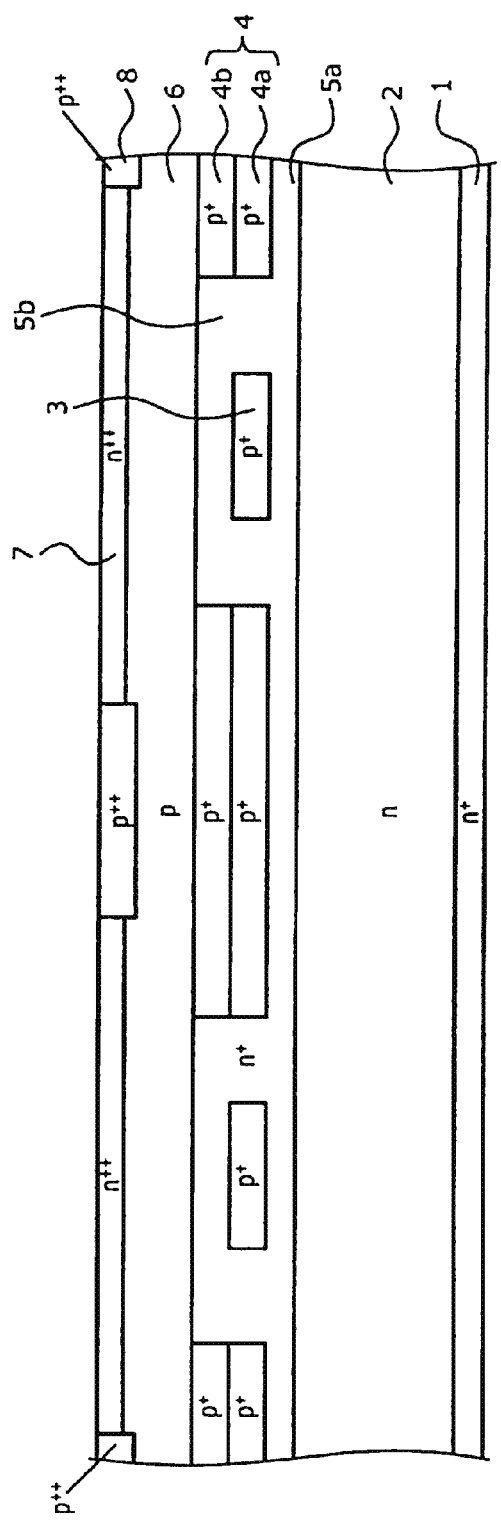
FIG. 5 is a fourth cross-sectional view of the silicon carbide semiconductor device of an embodiment during manufacturing.

Next, the p-type base layer 6 is epitaxially grown on the second n+ region 5b and the top second p+ region 4b. Next, the n++ source region 7 is selectively formed in the surface layer of the p-type base layer 6 via photolithography and ion injection of an n-type impurity. Next, the p++ contact region 8 is selectively formed, via photolithography and ion injection of a p-type impurity, in the surface layer of the p-type base layer 6 so as to contact the n++ source region 7. The order in which the n++ source region 7 and p++ contact region 8 are formed may be switched. After ion injection has completely finished, activation annealing is performed. This state is shown in FIG. 5.

Figure 6:
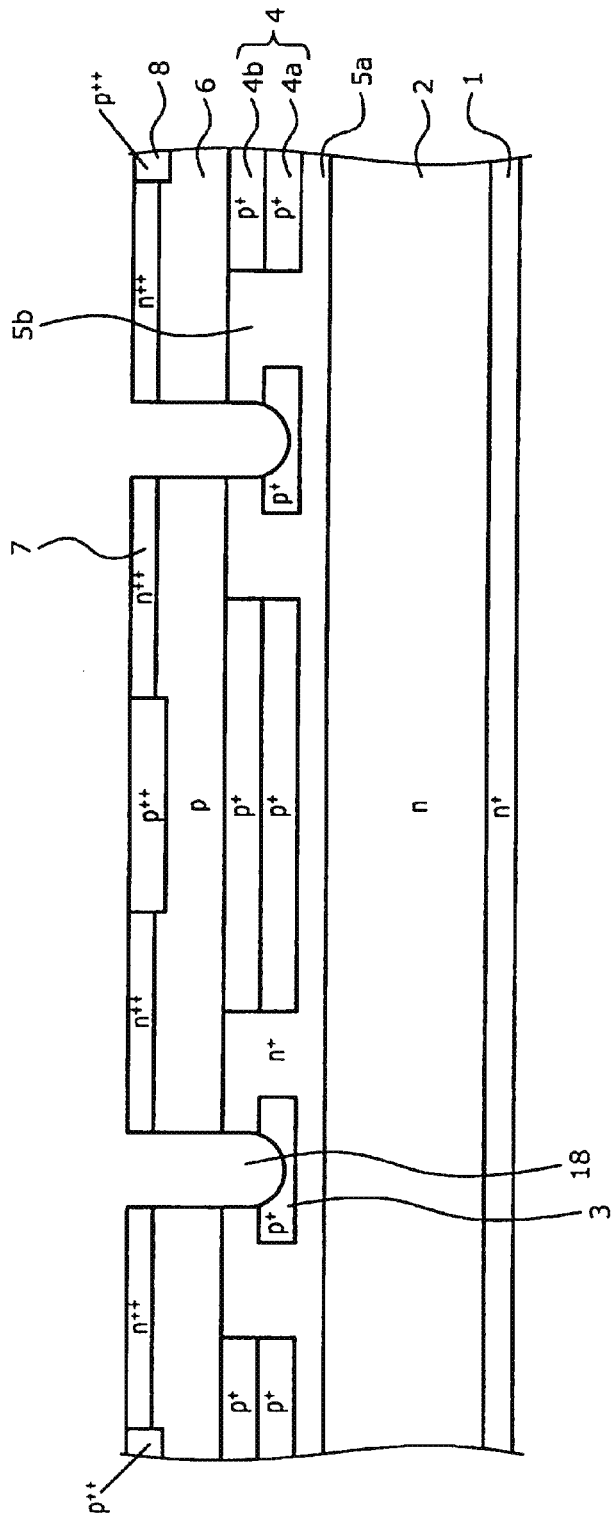
FIG. 6 is a fifth cross-sectional view of the silicon carbide semiconductor device of an embodiment during manufacturing.

Next, the trench 18 that reaches the first p+ region 3 inside the n+ region 5 is formed penetrating through the n++ source region 7 and p-type base layer 6 via photolithography and etching. An oxide film is used for the mask during forming of the trench. Furthermore, after the trench has been etched, isotropic etching for removing damage to the trench 18 or hydrogen annealing for rounding the bottom of the trench 18 or the corners of the opening of the trench 18 may be performed. It is permissible to perform only one of either the isotropic etching or hydrogen annealing. Alternatively, hydrogen annealing may be performed after isotropic etching has been performed. This state is shown in FIG. 6.

Figure 7:
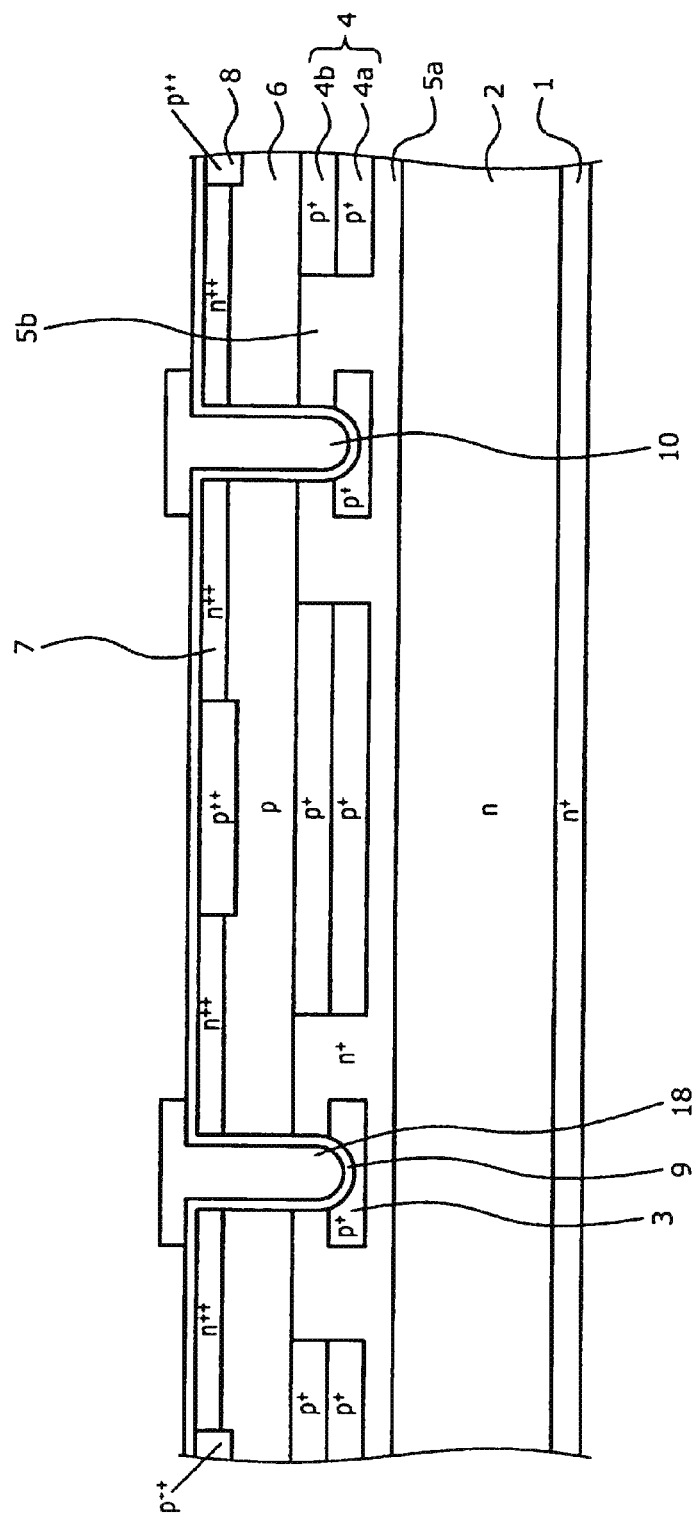
FIG. 7 is a sixth cross-sectional view of the silicon carbide semiconductor device of an embodiment during manufacturing.

Next, the gate oxide film 9 is formed along the front surface of the silicon carbide base material 100 and the inner walls of the trench 18. Next, polysilicon, for example, is deposited so as to fill the trench 18 and then etched to leave polysilicon that will serve as the gate electrode 10 inside the trench 18. During this, etch-back may be performed to etch such that the polysilicon is left further inside than the base material surface section, or patterning and etching may be performed to cause the polysilicon to protrude outward from the base material surface section. This state is shown in FIG. 7.

Figure 8:
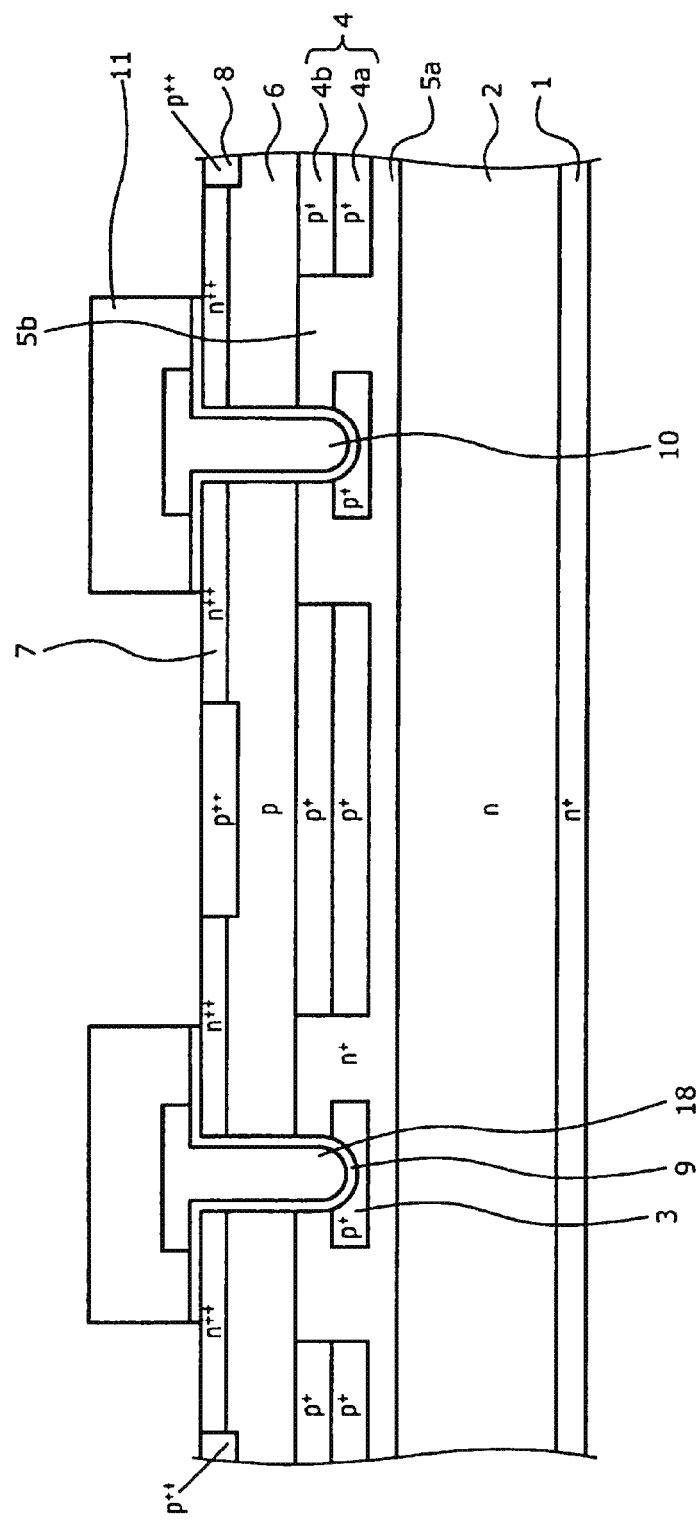
FIG. 8 is a seventh cross-sectional view of the silicon carbide semiconductor device of an embodiment during manufacturing.

Next, the first interlayer insulating film 11 is formed on the entire front surface of the silicon carbide base material 100 in order to cover the gate electrode 10. The first interlayer insulating film 11 is made of NSG (nondoped silicate glass), PSG (phosphosilicate glass), BPSG (borophosphoosilicate glass), HTO (high temperature oxide), or a combination of these, for example. Next, the first interlayer insulating film 11 and gate oxide film 9 are patterned to form the contact hole, which exposes the n+ source region 7 and p++ contact region 8. This state is shown in FIG. 8.

Figure 9:
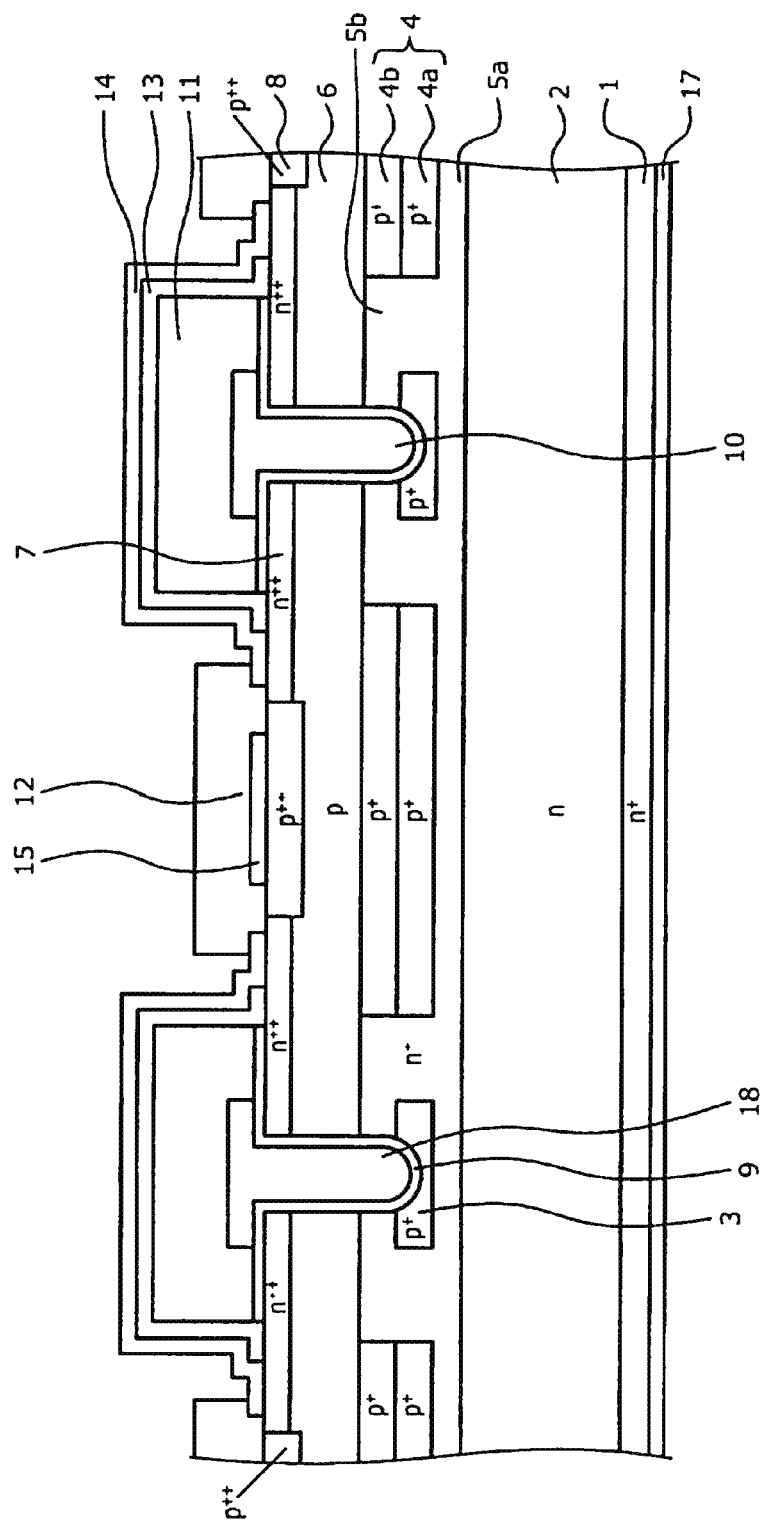
FIG. 9 is an eighth cross-sectional view of the silicon carbide semiconductor device of an embodiment during manufacturing.

Next, the barrier metal 13 is formed to cover the first interlayer insulating film 11 and patterned, and the n++ source region 7 and p++ contact region 8 are exposed again. Next, the first source electrode 14 is formed so as to contact the n++ source region 7. The first source electrode 14 may be formed to cover the barrier metal 13, or alternatively may be left only inside the contact hole. Next, the second source electrode 15 is formed so as to contact the p++ contact region 8. Next, the second interlayer insulating film 12 is formed so as to cover the second source electrode 15. This state is shown in FIG. 9.

Next, the source electrode pad 16 is formed so as to fill the contact hole. Alternatively, a portion of the metal layer deposited to form the source electrode pad 16 may serve as a gate pad. On the rear surface of the n+ silicon carbide base material 1, sputtering, evaporation, or the like is used on the contact section of the drain electrode 17 to form a metal film such as a nickel (Ni) film or titanium (Ti) film. This metal film may be a plurality of Ni films and Ti films combined and layered together. Thereafter, annealing such as rapid thermal annealing (RTA) is performed in order to silidicize the metal film and form an Ohmic contact. Afterwards, a thick film such as a multilayer film in which a Ti film, Ni film, and gold (Au) have been layered together in this order is formed by electron beam (EB) evaporation, for example, in order to form the drain electrode 17.

In the epitaxial growth and ion injection described above, nitrogen (N), phosphorous (P), arsenic (As), antimony (Sb), or the like that will be n-type with respect to silicon carbide should be used as the n-type impurity (n-type dopant), for example. The p-type impurity (p-type dopant) should be boron (B), aluminum (Al), gallium (Ga), indium (In), thallium (Tl), or the like that will be p-type with respect to silicon carbide, for example. This completes the MOSFET shown in FIG. 1.

As described above, the silicon carbide semiconductor device of one embodiment makes it possible to draw the bipolar current outside due to the second source electrode contacting only the p++ contact region. This makes it possible to measure the bipolar current with an external circuit and to control the gate voltage based on the measured bipolar current such that the bipolar current is set to less than or equal to a prescribed value. Thus, it is possible to prevent expansion of stacking faults during operation of the inverter circuit; to cause stacking faults that have expanded to contract; and to prevent an increase in the ON resistance of the silicon carbide semiconductor device. When the silicon carbide semiconductor device is applied to an inverter circuit, it becomes harder for bipolar deterioration to occur, for example. Furthermore, even if bipolar deterioration were to occur, it is possible to cause the stacking faults to contract during circuit operation, which makes it possible to improve the long-term reliability of the silicon carbide semiconductor device.

WORKING EXAMPLE 1

In the working examples below, a method of controlling gate voltage based on the current value measured by the second source electrode 15 will be described in detail by using an inverter circuit as an example. In Working Examples 1 to 4 below, the explanations use a 1200V breakdown class trench-gate silicon carbide MOSFET as an example.

Figure 10:
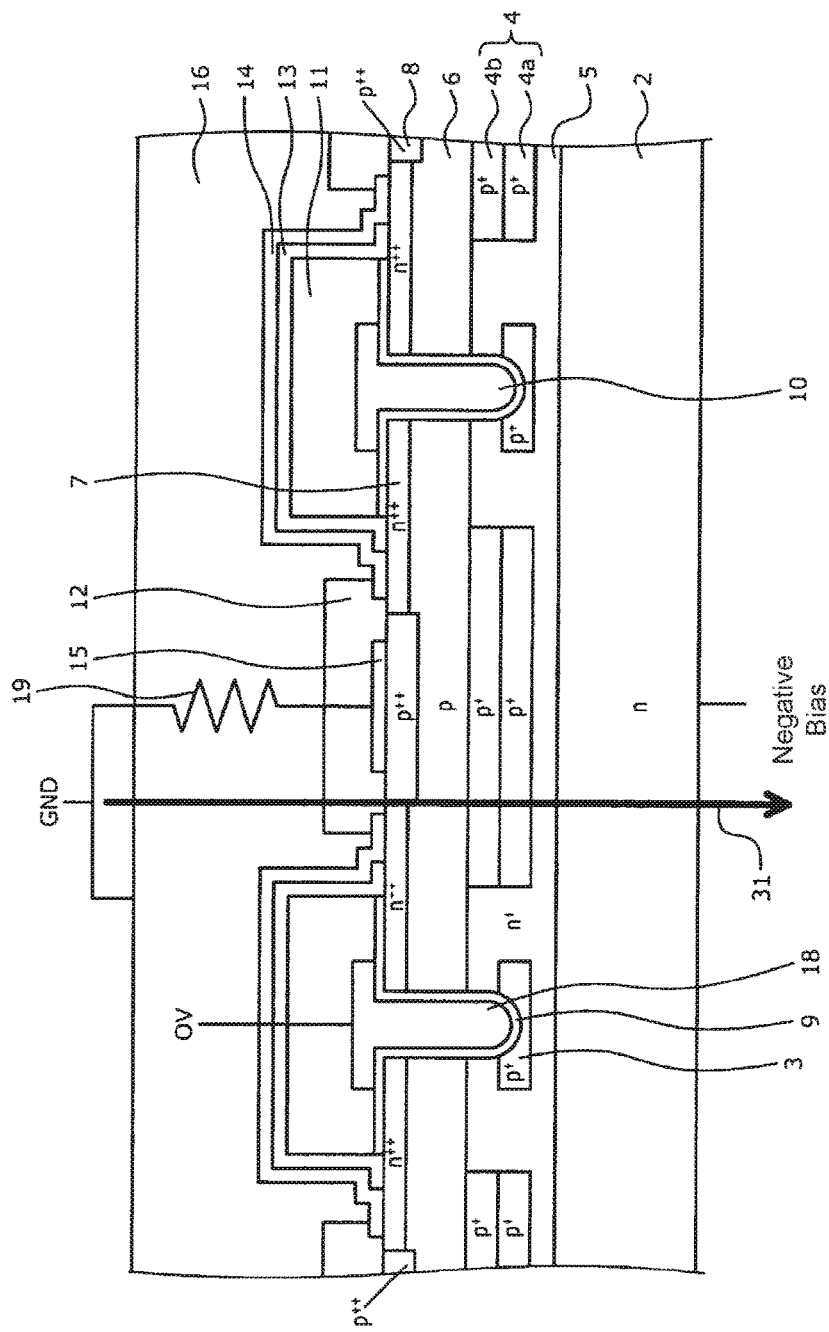
FIG. 10 is a cross-sectional view of the current path in the bipolar mode of the silicon carbide semiconductor device of Working Example 1.

FIG. 10 is a cross-sectional view of the current path in the bipolar mode of the silicon carbide semiconductor device of Working Example 1. In Working Example 1, an external resistor 19 connects to the second source electrode 15 of the MOSFET, or a polysilicon resistor is integrated on the MOSFET and connects to the first source electrode 14 from the second source electrode 15 via the resistor. FIG. 10 shows a case in which the external resistor 19 connects to the second source electrode 15 of the MOSFET.

As shown in FIG. 10, when the lower arm is in recovery mode, the principal current (load current) of the inductance component of the load continues to flow, which causes recovery current 31 to flow to the built-in diode of the lower arm MOSFET. When the recovery current 31 flows, the potential of the drain electrode 17 becomes lower than the potential of the first source electrode 14. When the built-in diode is forward biased, bipolar current begins to flow, but because the external resistor is connected to the second source electrode 15 the potential of the p++ contact region 8 drops due to the voltage drop of the resistor. The p++ contact region 8 is connected to the p-type base layer 6, and the potential of the p-type base layer 6 drops at the same time. Accordingly, the potential of the gate electrode 10 becomes positive with respect to the potential of the p-type base layer 6, and soon an electron inversion layer is formed in the channel region and the MOS channel automatically turns ON.

Figure 11:
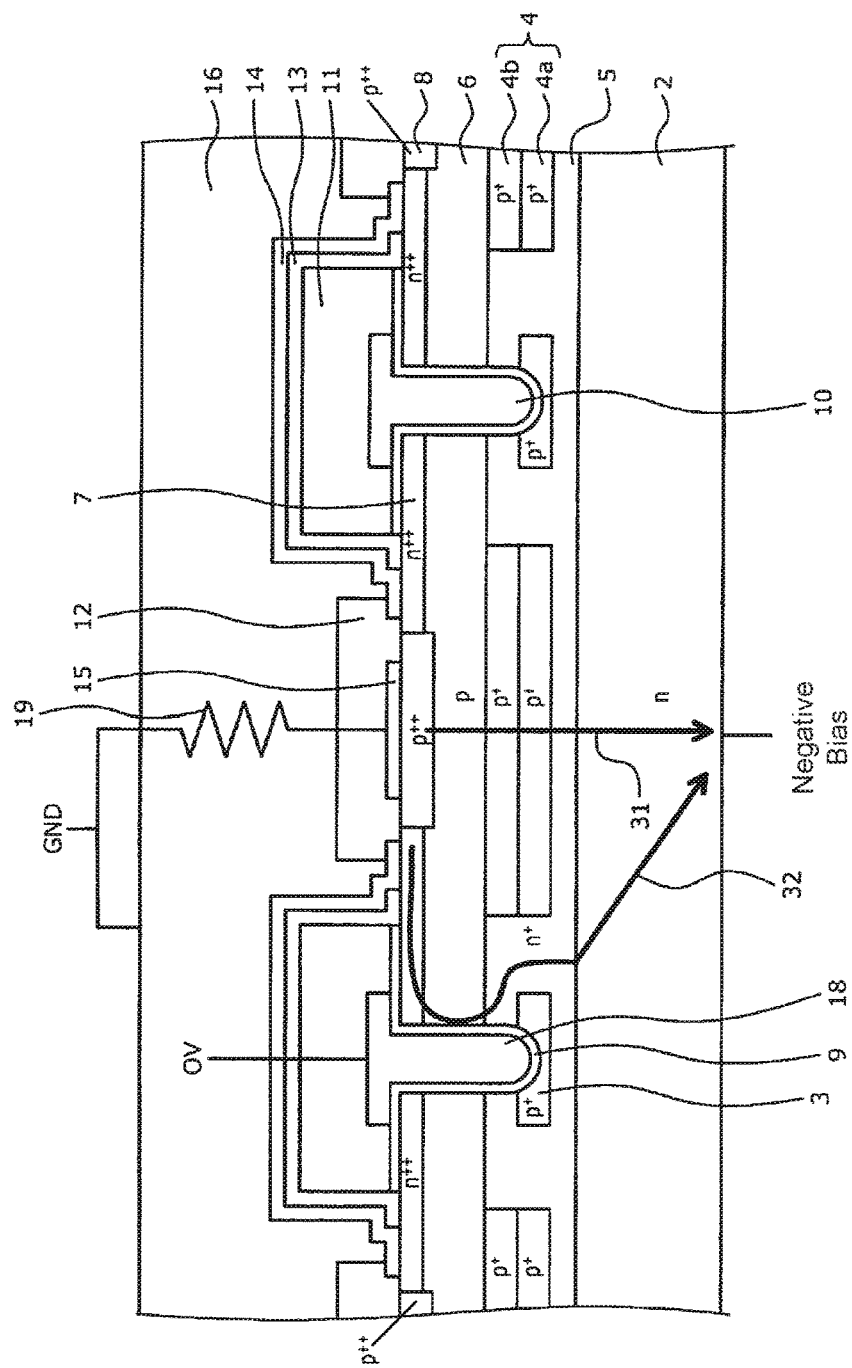
FIG. 11 is a cross-sectional view of an automatic gate ON operation of the silicon carbide semiconductor device of Working Example 1.
Figure 12:
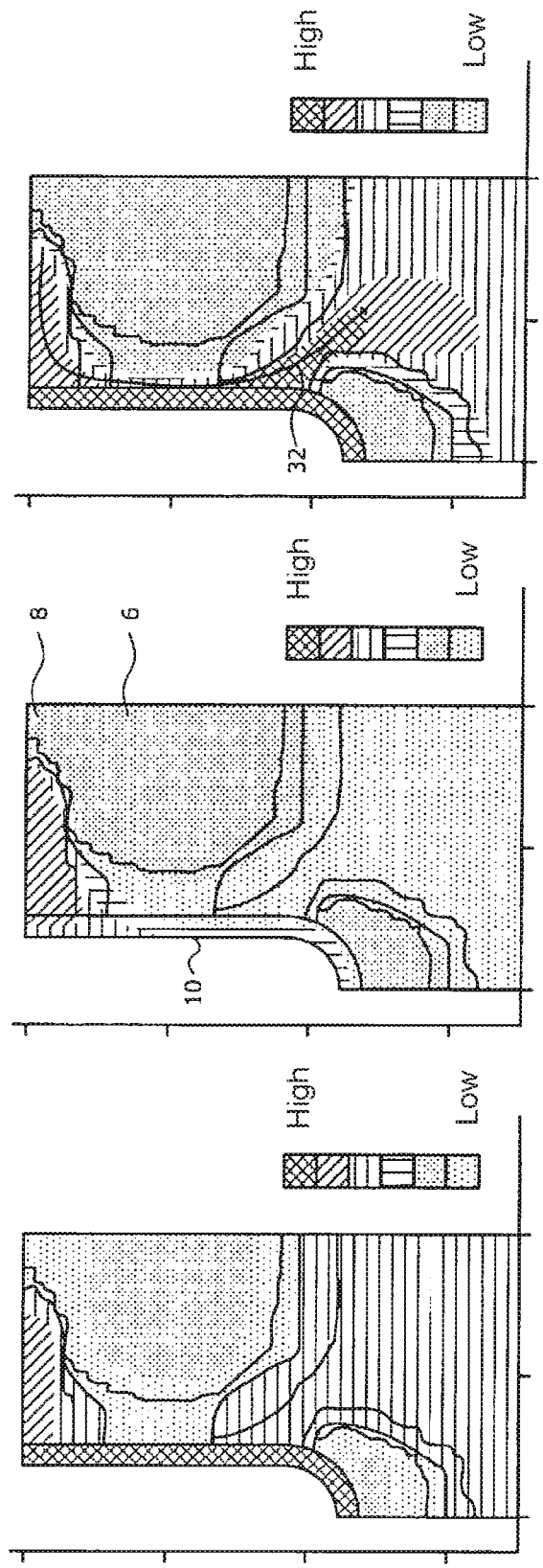
FIGS. 12A, 12B, and 12C are cross-sectional views of an internal state of the automatic gate ON operation of the silicon carbide semiconductor device of Working Example 1.

FIG. 11 is a cross-sectional view of an automatic gate ON operation of the silicon carbide semiconductor device of Working Example 1. As shown in FIG. 11, the MOS channel automatically turning ON causes the recovery current 32, which is electron current, to flow through the first source electrode 14. FIGS. 12A to 12C are cross-sectional views of an internal state of the automatic gate ON operation of the silicon carbide semiconductor device of Working Example 1. FIG. 12 is the simulation results of internal doping distribution, potential distribution, and electron current distribution when the MOS channel automatically turns ON. FIG. 12A shows the concentration distribution of the impurities in the silicon carbide semiconductor device. FIG. 12B shows the potential distribution of the silicon carbide semiconductor device. FIG. 12C shows the electron current distribution of the silicon carbide semiconductor device.

From FIG. 12B, it can be understood that the potential of the $p^{++}$ contact region 8 and p-type base layer 6 drops and the potential of the gate electrode 10 becomes positive with respect to the potential of the p-type base layer 6. Furthermore, it can be understood from FIG. 12C that the electron current of the MOS channel becomes greater, the MOS channel automatically turns ON, and the recovery current 32 flows through the first source electrode 14.

The external resistor 19 is not connected to the first source electrode 14, and most of the recovery current 32 is electron current flowing through the first source electrode 14. Accordingly, there is almost no carrier recombination in the n-type drift layer 2. When the dead time period ends and the gate of the bottom arm MOSFET receives the ON signal, the MOS channel remains in an ON state without relying on the small amount of built-in diode current flowing through the second source electrode 15.

As described above, in Working Example 1, the resistor 19 connects to the second source electrode 15, which makes it possible to turn on the MOS channel automatically. By not allowing the recovery current 31 to flow to the built-in diode, it is possible to reduce carrier recombination and to inhibit bipolar deterioration during recovery mode.

WORKING EXAMPLE 2

Figure 13:
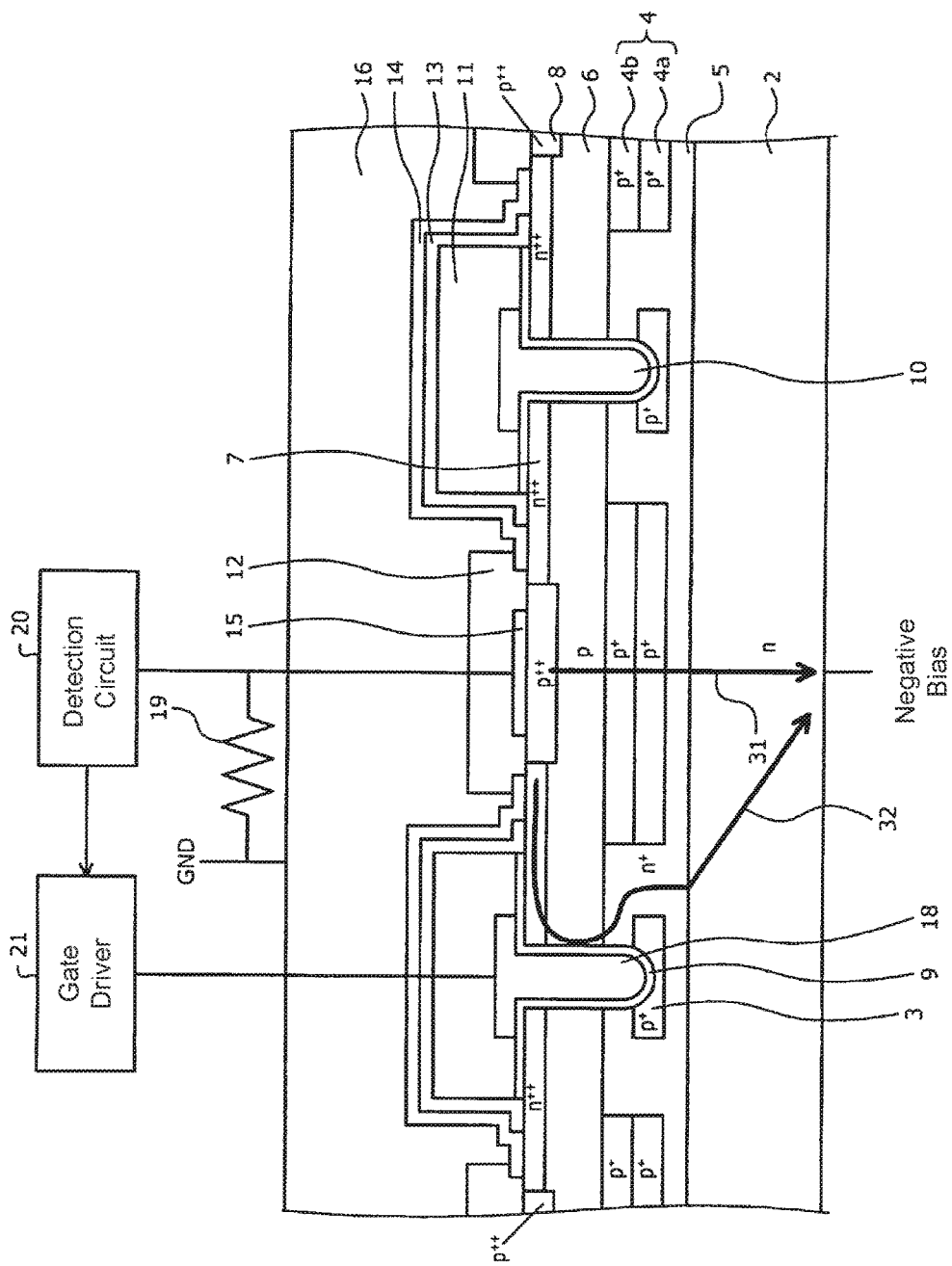
FIG. 13 is a cross-sectional view of a gate ON operation of an external detection circuit in the silicon carbide semiconductor device of Working Example 2.

In the method of Working Example 1 described above, during the dead time period a small amount of built-in diode current flows through the second source electrode 15, which automatically turns ON the MOS channel. In Working Example 2, the MOS channel in the lower arm can be turned ON faster than in Working Example 1 by detecting the recovery current 32 with an external circuit. FIG. 13 is a cross-sectional view of the gate ON operation of an external detection circuit in the silicon carbide semiconductor device of Working Example 2. As shown in FIG. 13, in Working Example 2, an external resistor 19 and a detection circuit 20 for detecting the potential of the second source electrode 15 connect to the second source electrode 15, and a gate driver 21 that can control the gate voltage based on the value detected by the detection circuit 20 connects to the gate electrode 10.

In Working Example 2, first the detection circuit 20 detects a drop in potential of the source electrode 15 caused by recovery current 31 flowing to the built-in diode. Next, the detection circuit 20 sends the detection value to the gate driver 21. Next, the gate driver 21 increases the gate voltage based on the detection value and turns ON the MOS channel. This causes the recovery current 32 to flow through the first source electrode 14.

As described above, in Working Example 2, it is possible to cause current to flow to the MOS channel without relying on automatic ON operation triggered by the current flowing to the built-in diode, and this makes it possible to turn ON the lower arm MOS channel faster than Working Example 1.

WORKING EXAMPLE 3

In Working Examples 1 and 2 above, the lower arm MOSFET of the inverter circuit was in recovery mode, but Working Example 3 shows a case in which an OFF signal is applied to the gate while the lower arm MOSFET is ON.

When the OFF signal is applied to the gate, the lower arm MOSFET begins a turn OFF operation, and displacement current begins to flow due to progression of the depletion layer inside the MOSFET. The displacement current flows toward the second source electrode 15 as hole current in the $p^{++}$ contact region 8 and is the reverse direction of the recovery current during recovery mode. Thus, the voltage drop in the resistor 19 connected to the second source electrode 15 causes the potential of the $p^{++}$ contact region 8 to rise.

Accordingly, the pn junction constituted by the $p^{++}$ contact region 8 and $n^+$ region 5 becomes forward biased, and bipolar operations are generated such as electrons being injected from the $n^+$ region 5 and flowing into the n-type drift layer 2. In this manner, electron current continues to flow regardless of the MOS channel being OFF, which greatly increases the damage. Moreover, the heat generated by this current may destroy the MOSFET.

Figure 14:
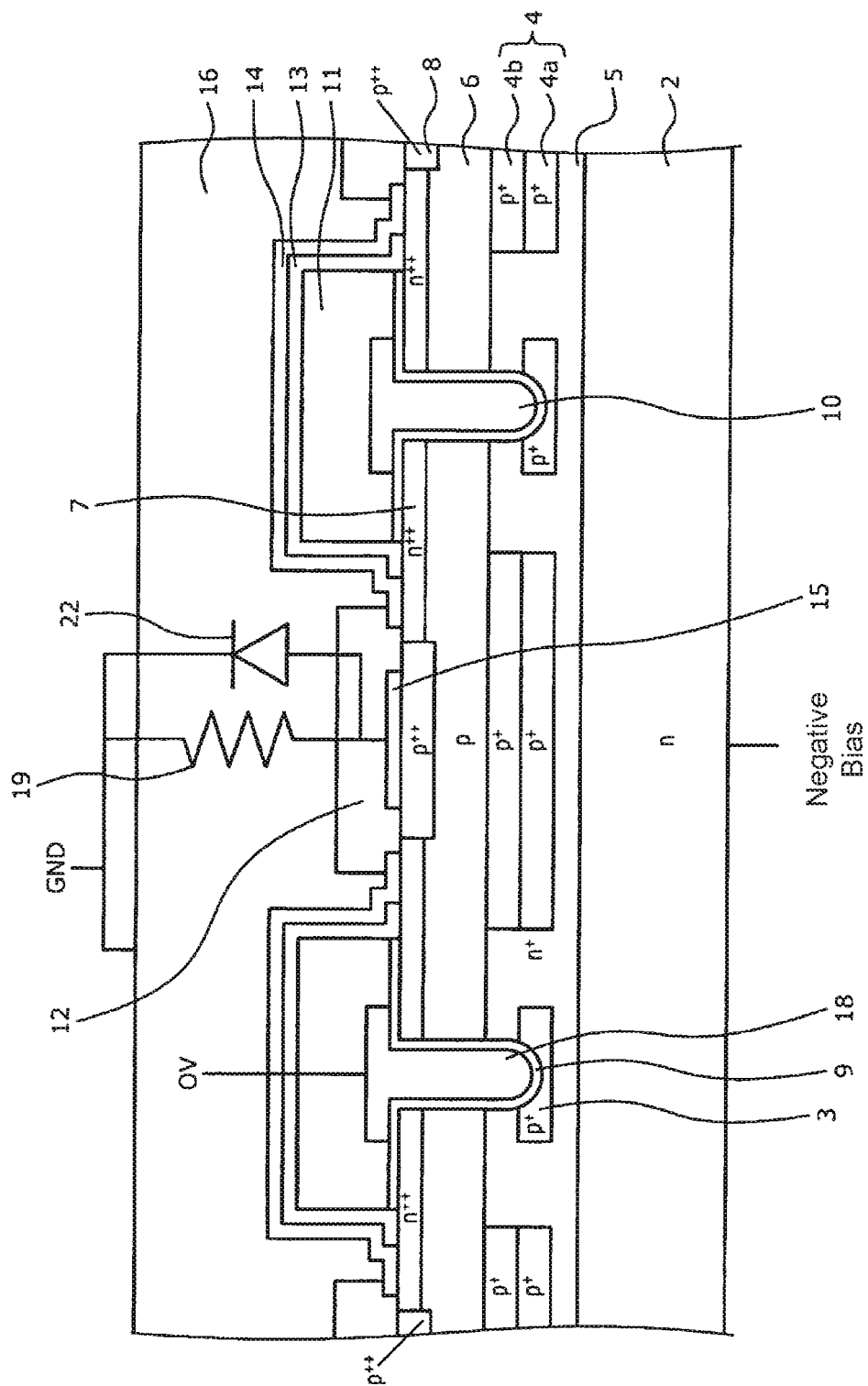
FIG. 14 is a cross-sectional view of a silicon diode connection of the silicon carbide semiconductor device of Working Example 3.

Therefore, in Working Example 3, a silicon diode 22 connects to outside of the second source electrode 15, or a polysilicon diode is integrated on the silicon carbide semiconductor device. FIG. 14 is a cross-sectional view of the silicon diode connection of the silicon carbide semiconductor device of Working Example 3.

Lowering the current on-set voltage of the silicon diode 22 to less than the ON voltage of the silicon carbide pn junction makes it possible draw the hole current out of the silicon carbide semiconductor device before the pn junction turns ON inside the silicon carbide semiconductor device. This allows the hole current to easily flow out from the $p^{++}$ contact region 8 via the silicon diode 22, which makes it possible to inhibit voltage drops of the resistor 19. Thus, it is possible to prevent breakdown when the MOS channel turns OFF.

By combining the structure of the silicon carbide semiconductor, the external circuit of the silicon carbide semiconductor, and the method of controlling the silicon carbide semiconductor as described in Working Examples 1 to 3 above, it is possible to inhibit bipolar deterioration during recovery mode of the silicon carbide MOSFET.

WORKING EXAMPLE 4

The method shown in Working Examples 1 to 3 inhibits bipolar deterioration during recovery mode of the silicon carbide MOSFET, but does not completely prevent it. A small amount of hole current flows through the n-type drift layer 2, and thus the stacking faults may expand cumulatively as the usage time of the silicon carbide MOSFET becomes longer.

As a countermeasure, in Working Example 4, the gate voltage is controlled to an appropriate value to cause the stacking faults to contract by controlling the proportion of current flowing to the built-in diode with respect to the current flowing through the MOS channel during the synchronous rectification period in which the gate is turned ON in the MOSFET where the recovery current is flowing. For example, setting the hole current density to less than or equal to 1 $A/cm^2$ during the synchronous rectification period makes it possible to cause stacking faults that have already expanded to contract.

The optimal hole current density at which contraction of the stacking faults is fastest is determined by parameters such as the impurity concentration of the p-type base layer 6, the impurity concentration of the $n^+$ silicon carbide substrate 1, the carrier life time of the n-type drift layer 2, and the temperature of the semiconductor device. The set current value is determined in advance based on these parameters.

Figure 15:
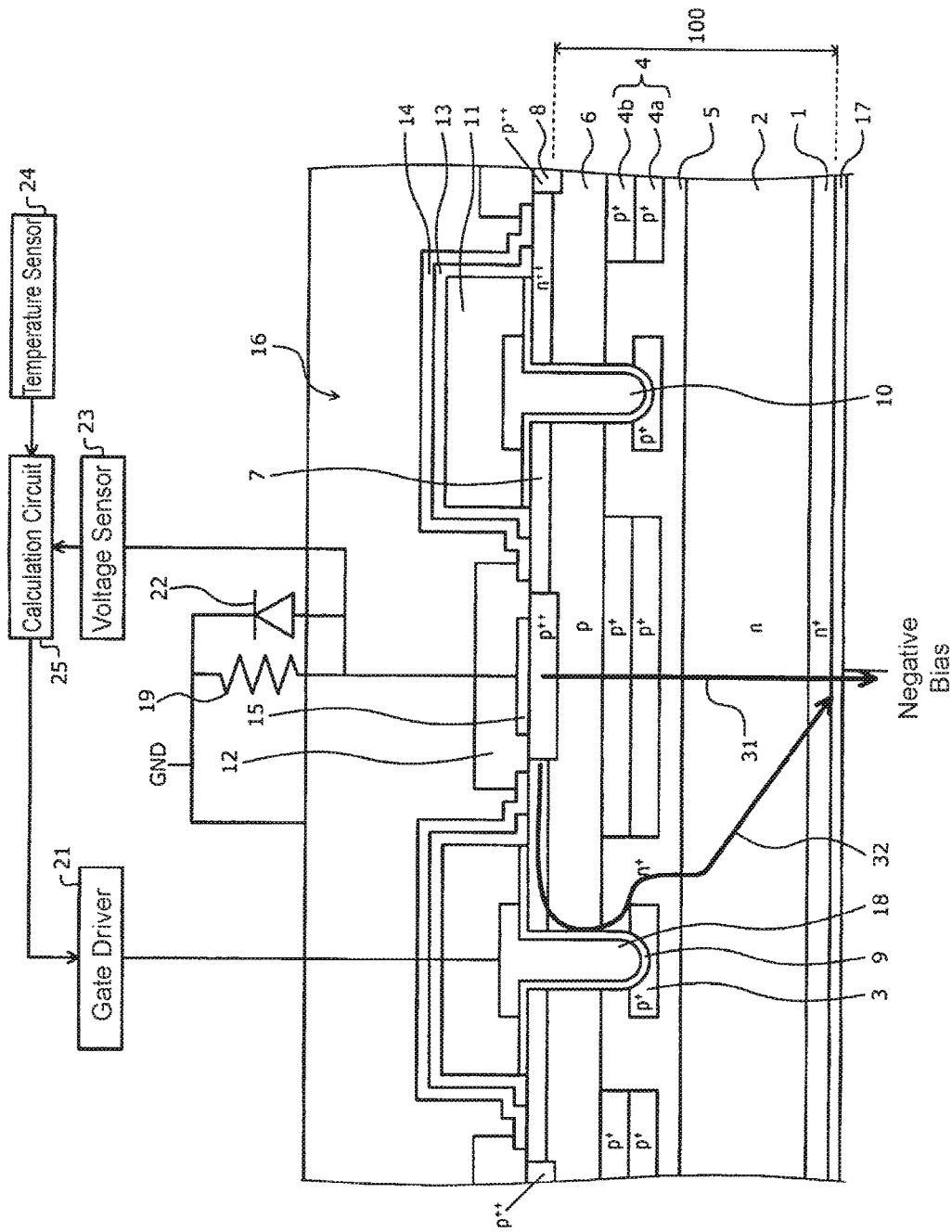
FIG. 15 is a cross-sectional view of the silicon carbide semiconductor device and external circuit of Working Example 4.

FIG. 15 is a cross-sectional view of the silicon carbide semiconductor device and external circuit of Working Example 4. In Working Example 4, a voltage sensor 23, temperature sensor 24, and calculation circuit 25 connect to an external circuit, in addition to the external resistor 19, gate driver 21, and silicon diode 22. The voltage sensor 23 detects voltage drop of the external resistor 19, and the temperature sensor 24 detects the temperature of the silicon carbide semiconductor device. The voltage sensor 23 detecting the voltage drop of the external resistor 19 makes it possible to calculate the current flowing to the second source electrode 15, or namely the current flowing to the built-in diode. The current flowing to the second source electrode 15 may measure a voltage at a specific instance (an instantaneous value), or may measure an average value of a prescribed time (a time average value).

The calculation circuit 25 performs, with respect to the gate driver 21, control whereby the calculation circuit compares the measured current value to the set current value and lowers the gate voltage if the current value of the built-in diode is greater than the set current value or increases the gate voltage in the opposite case. In this manner, the calculation circuit 25 performs control such that the current flowing through the built-in diode becomes less than or equal to the set current value. If the gate voltage is high, the resistance of the MOS channel decreases, and most of the recovery current becomes channel current. On the other hand, if the gate voltage is too low, the resistance of the MOS channel increases, and most of the recovery current becomes built-in diode current. Therefore, by controlling the gate voltage, it is possible to perform control such that the current flowing through the built-in diode becomes less than or equal to the set current value by controlling the proportion of current flowing to the built-in diode with respect to the current flowing through the MOS channel.

In this manner, in Working Example 4, it is possible to control the hole current injected from the $p^{++}$ contact region 8 to less than or equal to the set current value. Therefore, the silicon carbide semiconductor device of Working Example 4 can cause stacking faults to contract during synchronous rectification when hole current is flowing.

Figure 16:
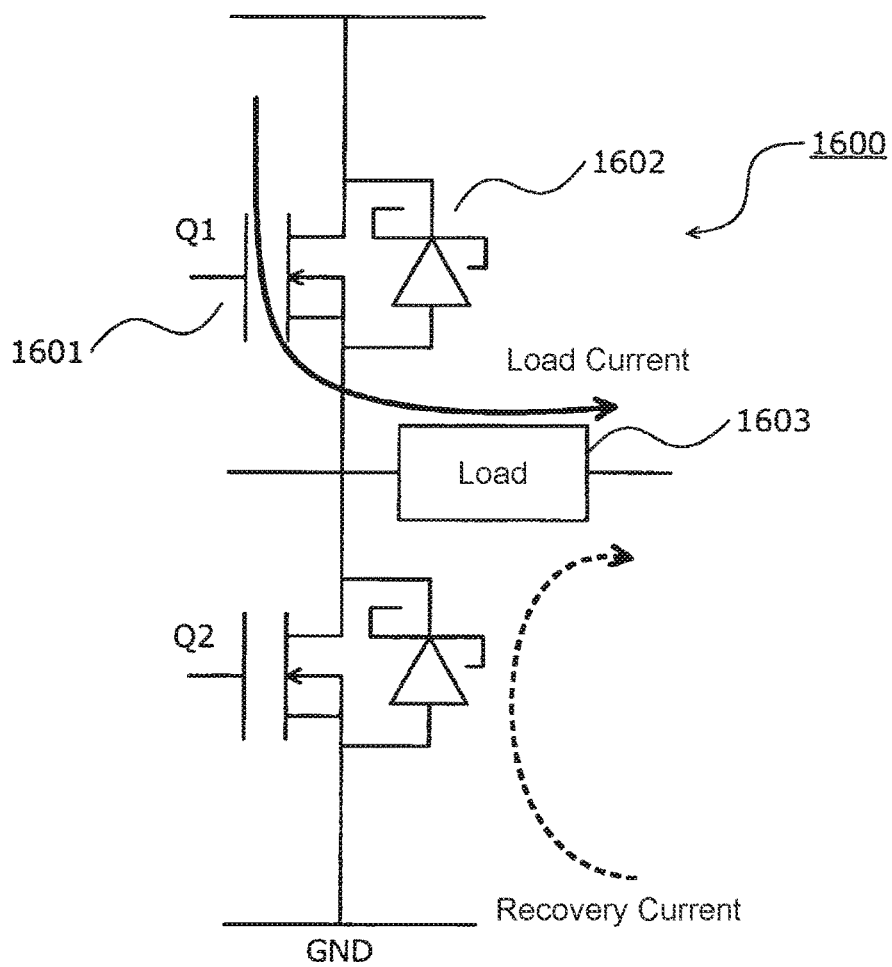
FIG. 16 shows one example of an inverter circuit using the silicon carbide semiconductor device in an embodiment of Working Example 4.
Figure 17:
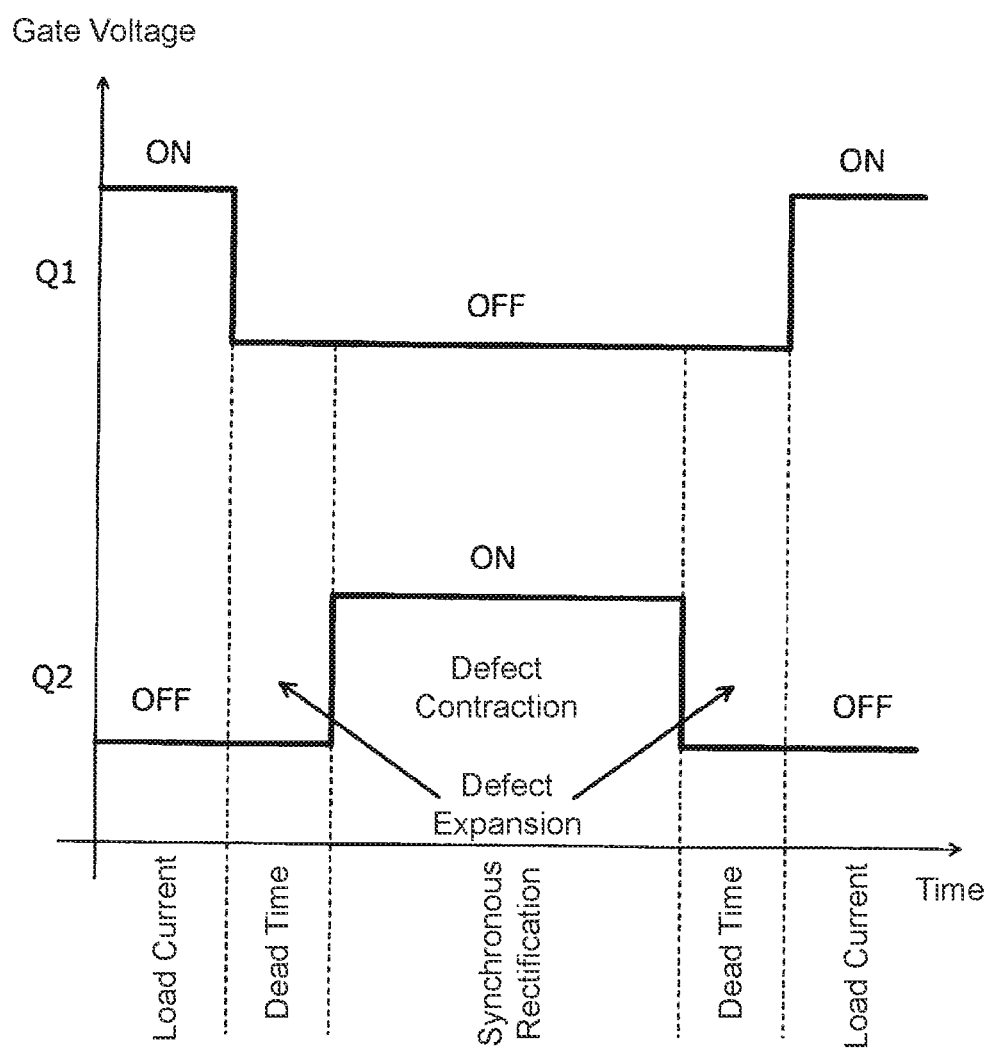
FIG. 17 shows the operation timing of the silicon carbide semiconductor device of Working Example 4 and expansion or contraction of stacking faults.
Figure 18:
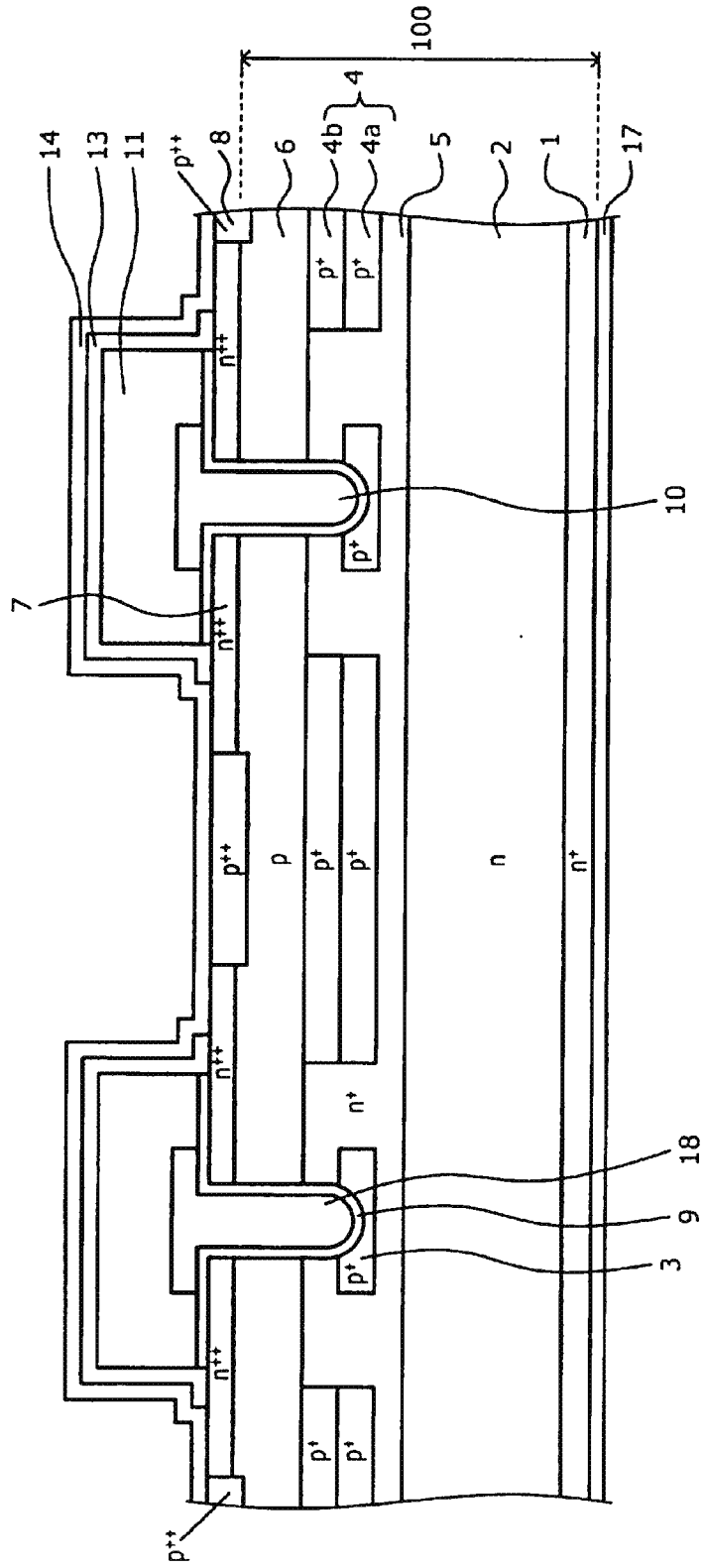
FIG. 18 is a cross-sectional view of a structure of a conventional silicon carbide semiconductor device.
Figure 19:
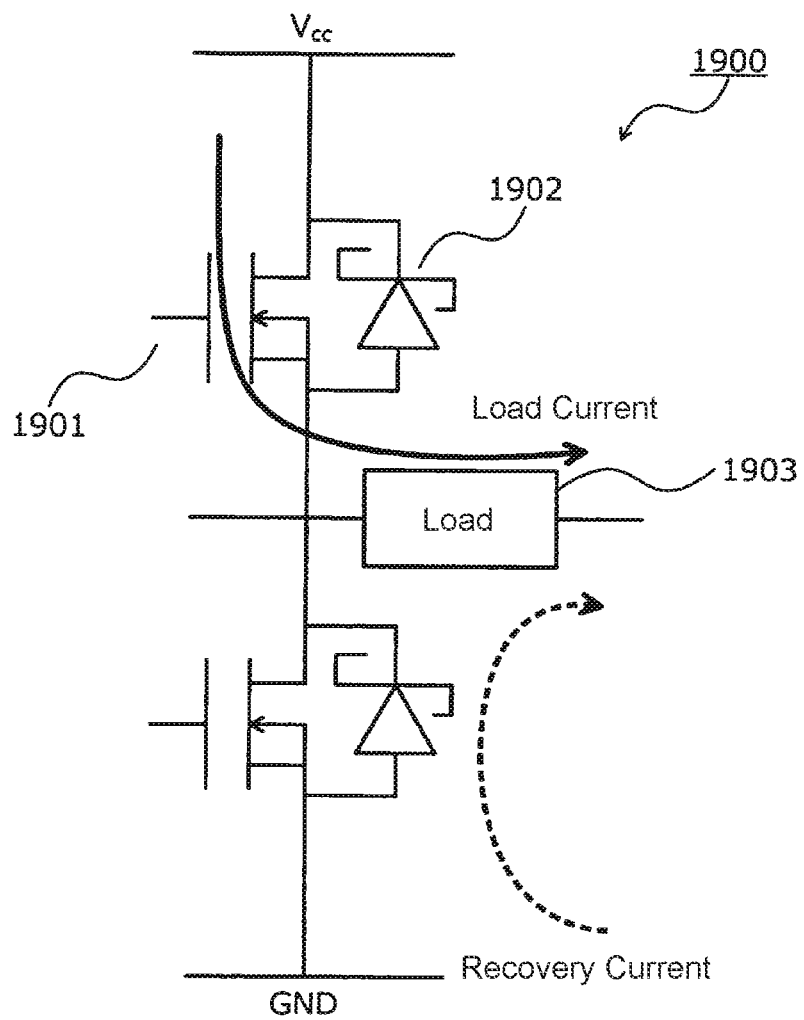
FIG. 19 is one example of an inverter circuit using a conventional silicon carbide MOSFET.

FIG. 16 shows one example of an inverter circuit using the silicon carbide semiconductor device in an embodiment of Working Example 4. The inverter circuit 1600 includes a plurality of MOSFETs 1601 of one embodiment, and the circuit drives a load 1603 such as motor. In FIG. 16, a diode 1602 shows the parasitic pn diode 1602 of the MOSFET 1601. FIG. 17 shows the operation timing of the silicon carbide semiconductor device of Working Example 4 and expansion or contraction of stacking faults. The vertical axis shows gate voltage and the horizontal axis shows time.

In FIG. 17, ON indicates that the gate is ON, and OFF indicates that the gate is OFF. Furthermore, Q1 shows the upper arm MOSFET 1601, and Q2 shows the lower arm MOSFET 1601. Moreover, on the horizontal axis, the period indicated by the load current is when the gate of the lower arm MOSFET 1601 (hereinafter, "Q2") is OFF and load current is flowing to Q2. The period indicated by dead time is when both gates of the lower arm MOSFET 1601 and Q2 are OFF and the hole current injected from the $p^{++}$ contact region 8 is causing stacking faults to expand. The period indicated by synchronous rectification is when the gate of Q2 is OFF and recovery current is flowing to Q2. The recovery current flowing in this period is controlled to be less than or equal to the set current value and is when the stacking faults contract.

INDUSTRIAL APPLICABILITY

As described above, a silicon carbide semiconductor device, a method of manufacturing a silicon carbide semiconductor device, and a method of controlling a silicon carbide semiconductor device according to the present invention is useful for power semiconductor devices used in power supplies or the like for power converters or various types of industrial machinery, and particularly suited for trench-gate silicon carbide semiconductor devices.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A silicon carbide semiconductor device, comprising:
   a first semiconductor layer of a first conductivity type in a front surface of a silicon carbide substrate;
   a second semiconductor layer of a second conductivity type on a side of the first semiconductor layer opposite to the silicon carbide substrate;
   a first semiconductor region of the first conductivity type selectively disposed inside the second semiconductor layer and having a higher impurity concentration than the silicon carbide substrate;
   a second semiconductor region of the second conductivity type selectively disposed inside the second semiconductor layer and having a higher impurity concentration than the second semiconductor layer;
   a gate oxide film contacting the second semiconductor layer;
   a gate electrode on a face of the gate oxide film opposite to a face of the gate oxide film contacting the second semiconductor layer;
   a first electrode contacting the first semiconductor region;
   a second electrode contacting the second semiconductor region and separated from the first electrode; and
   a third electrode on a rear surface of the silicon carbide substrate.

2. The silicon carbide semiconductor device according to claim 1,
   wherein the silicon carbide semiconductor device has a trench vertically penetrating the second semiconductor layer,
   wherein the gate electrode is inside the trench and the gate oxide film is between gate electrode and the trench.

3. The silicon carbide semiconductor device according to claim 1, wherein the second electrode is connected to the first electrode via an electrical resistor.

4. The silicon carbide semiconductor device according to claim 1,
   wherein the second electrode is connected to the first electrode via an electrical resistor and a diode, and
   wherein the diode is connected via a cathode thereof to the first electrode and connected via an anode thereof to the second electrode.

5. The silicon carbide semiconductor device according to claim 4, wherein the electrical resistor and the diode are made of polysilicon deposited on the silicon carbide semiconductor device.

6. A method of manufacturing a silicon carbide semiconductor device, comprising:
 forming a first semiconductor layer of a first conductivity type in a front surface of a silicon carbide substrate;
 forming a second semiconductor layer of a second conductivity type on a side of the first semiconductor layer opposite to the silicon carbide substrate;
 selectively forming a first semiconductor region of the first conductivity type inside the second semiconductor layer at a higher impurity concentration than the silicon carbide substrate;
 selectively forming a second semiconductor region of the second conductivity type inside the second semiconductor layer and at a higher impurity concentration than the second semiconductor layer;
 forming a gate oxide film contacting the second semiconductor layer;
 forming a gate electrode on a face of the gate oxide film opposite to a face of the gate oxide film contacting the second semiconductor layer;
 forming a first electrode contacting the first semiconductor region;
 forming a second electrode contacting the second semiconductor region and separated from the first electrode; and
 forming a third electrode in a rear surface of the silicon carbide substrate.

7. A method of controlling a silicon carbide semiconductor device that comprises:
 a first semiconductor layer of a first conductivity type in a front surface of a silicon carbide substrate;
 a second semiconductor layer of a second conductivity type on a side of the first semiconductor layer opposite to the silicon carbide substrate;
 a first semiconductor region of the first conductivity type selectively disposed inside the second semiconductor layer and having a higher impurity concentration than the silicon carbide substrate;
 a second semiconductor region of the second conductivity type selectively disposed inside the second semiconductor layer and having a higher impurity concentration than the second semiconductor layer;
 a gate oxide film contacting the second semiconductor layer;
 a gate electrode on a face of the gate oxide film opposite to a face of the gate oxide film contacting the second semiconductor layer;
 a first electrode contacting the first semiconductor region;
 a second electrode contacting the second semiconductor region and separated from the first electrode; and
 a third electrode in a rear surface of the silicon carbide substrate,
 the method of controlling the silicon carbide semiconductor device comprising:
 measuring a value of current flowing to the second electrode from outside when currents are flowing from the first electrode and the second electrode toward the third electrode within the silicon carbide semiconductor device; and
 adjusting a proportion of the current flowing from the first electrode to the third electrode and the current flowing from the second electrode to the third electrode by setting a voltage applied to the gate electrode in accordance with the value of the current that has been measured.

8. The method of controlling the silicon carbide semiconductor device according to claim 7, wherein the step of measuring measures an instantaneous value of the current flowing to the second electrode.

9. The method of controlling the silicon carbide semiconductor device according to claim 7, wherein the step of measuring measures an average value over a prescribed duration of the current flowing to the second electrode.

10. The method of controlling the silicon carbide semiconductor device according to claim 7, further comprising:
 measuring a temperature of the silicon carbide semiconductor device,
 wherein the step of adjusting the proportion sets a voltage applied to the gate electrode in accordance with the value of the current and the temperature that have been measured.

11. The method of controlling the silicon carbide semiconductor device according to claim 7, wherein when the currents are flowing from the first electrode and the second electrode toward the third electrode, the current flowing toward the second electrode from outside is adjusted to be less than or equal to a prescribed value to cause contraction of crystal defects in the silicon carbide semiconductor device.

* * * * *